US006958543B2

(12) United States Patent  
Nakayama

(10) Patent No.: US 6,958,543 B2  
(45) Date of Patent: Oct. 25, 2005

(54) SEMICONDUCTOR EQUIPMENT WITH LATERAL AND VERTICAL MOS REGIONS

(75) Inventor: Yoshiaki Nakayama, Okazaki (JP)

(73) Assignee: Denso Corporation, Kariya (JP)

( * ) Notice: Subject to any disclaimer, the term of this patent is extended or adjusted under 35 U.S.C. 154(b) by 45 days.

(21) Appl. No.: 10/682,890

(22) Filed: Oct. 14, 2003

(65) Prior Publication Data

US 2004/0075113 A1 Apr. 22, 2004

(30) Foreign Application Priority Data

Oct. 15, 2002 (JP) ............................. 2002-300703
Sep. 9, 2003 (JP) ............................. 2003-317047

(51) Int. Cl.[7] .............................................. H01L 23/48
(52) U.S. Cl. ...................... 257/758; 257/335; 257/341; 257/342; 257/343; 438/306
(58) Field of Search ............................... 257/335, 341, 257/342, 343; 438/306

(56) References Cited

U.S. PATENT DOCUMENTS

| 4,636,825 | A | | 1/1987 | Baynes |
| 4,948,754 | A | | 8/1990 | Kondo et al. |
| 5,192,989 | A | | 3/1993 | Matsushita et al. |
| 5,412,239 | A | | 5/1995 | Williams |
| 5,672,894 | A | * | 9/1997 | Maeda et al. ................ 257/343 |
| 6,133,107 | A | * | 10/2000 | Menegoli ...................... 438/306 |

FOREIGN PATENT DOCUMENTS

JP A-H03-239369 10/1991
JP A-H07-263665 10/1995

OTHER PUBLICATIONS

"International Rectifier", IRF6150, PD-93943, pp. 2-3.
Hazel Schofield et al., FlipFET™ MOSFET Design for High Volume SMT Assembly, *International Rectifier*, pp. 1-6.
Hazel Schofield et al., Assembly of FlipFET™ Devices, *International Rectifier*, AN-1011, May 22, 2000, pp. 1-6.

* cited by examiner

*Primary Examiner*—David Nelms
*Assistant Examiner*—Mai-Huong Tran
(74) *Attorney, Agent, or Firm*—Posz Law Group, PLC

(57) ABSTRACT

Semiconductor equipment includes a semiconductor substrate, a plurality of first type semiconductor devices having first and second device regions, a plurality of second type semiconductor devices having the first and second device regions, and upper and lower layer wirings disposed on the substrate. The upper and lower layer wirings electrically connect a plurality of first and second device regions together with a parallel connection, respectively. The lower layer wiring includes a first contact for connecting to the first device region and a second contact for connecting to the second device region. The first contact is concentrated into a predetermined area. The second contact surrounds the first contact. The upper layer wiring disposed on the predetermined area provides a pad area for connecting to an external circuit.

32 Claims, 16 Drawing Sheets

SEMICONDUCTOR EQUIPMENT WITH LATERAL AND VERTICAL MOS REGIONS

CROSS REFERENCE TO RELATED APPLICATION

This application is based on Japanese Patent Applications No. 2002-300703 filed on Oct. 15, 2002, and No. 2003-317047 filed on Sep. 9, 2003, the disclosures of which are incorporated herein by reference.

FIELD OF THE INVENTION

The present invention relates to semiconductor equipment having a plurality of semiconductor devices and upper and lower layer wirings.

BACKGROUND OF THE INVENTION

Semiconductor equipment 100 having a plurality of semiconductor devices and upper and lower layer wirings according to a prior art is disclosed in Japanese Unexamined Patent Application Publication No. H07-263665. As shown in FIG. 16, the semiconductor equipment 100 includes a plurality of laterally diffused metal oxide semiconductor (i.e., L-DMOS) transistors 101 having a source region S and a drain region D. The L-DMOS transistors 101 are arranged to have a mesh structure. The first wiring layer as the lower layer wiring is formed on the source and drain regions S, D through the first interlayer insulation film. Further, the second wiring layer as the upper layer wiring is formed on the source and drain regions S, D through the second interlayer insulation film.

The lower layer wiring is composed of a plurality of the first source wirings 1 connecting to a plurality of the source regions S and a plurality of the first drain wirings 2 connecting to a plurality of the drain regions D. The upper layer wiring is composed of the second source wiring 3 and the second drain wiring 4. The second source wiring 3 connects to a plurality of first source wirings 1, and the second drain wiring 4 connects to a plurality of first drain wirings 2. The second source wiring 3 and the second drain wiring 4 almost equally divide the semiconductor equipment 100, and have a triangle shape. The second source wiring 3 and the second drain wiring 4 are bonded to a wire 8 by a wire bonding method and the like.

In the semiconductor equipment 100, the second source wiring 3 and the second drain wiring 4 disposed on the L-DMOS transistors 101 are directly bonded. Therefore, it is no need to form a pad region on a semiconductor substrate for bonding, so that an occupation area of the semiconductor equipment 100 is reduced, i.e., a chip size of the semiconductor equipment 100 is reduced.

The L-DMOS transistor 101 in the semiconductor equipment 100 has a cross-sectional structure shown in FIG. 17. FIG. 17 is an enlarged cross-sectional view showing the L-DMOS transistor 101. In the L-DMOS transistor 101, the first source wiring 1 and the first drain wiring 2 are arranged alternately. Therefore, the surfaces of both an insulation film such as the second interlayer insulation film 7 and a metal film such as the second drain wiring 4 have a large concavity and convexity. In a bonding process for bonding the wire 8, a crack 9 may arise in the second interlayer insulation film 7 disposed under the wire 8. Specifically, the crack 9 arises from a convexity and concavity portion 90 between the insulation film and the metal film. Therefore, the L-DMOS transistor 101 may short or leak current by the crack 9, so that the L-DMOS transistor 101 fails to operate. Further, the concavity and the convexity generated by both a LOCOS region 5 and a gate electrode 14 arise on the surface structure of the substrate. Therefore, a bonding strength between the wire 8 and the second drain wiring 4 becomes weak, so that the wire 8 may fails to bond to the second drain wiring 4.

SUMMARY OF THE INVENTION

In view of the above problem, it is an object of the present invention to provide semiconductor equipment having a plurality of semiconductor devices and upper and lower layer wirings. Specifically, the semiconductor equipment is limited to crack, so that an electric short circuit and current leakage in the equipment are reduced to occur.

It is another object of the present invention to provide semiconductor equipment having highly bonding strength between the upper layer wiring and a bonding wire or the like.

Semiconductor equipment includes a semiconductor substrate, a plurality of first type semiconductor devices having first and second device regions, a plurality of second type semiconductor devices having the first and second device regions, and upper and lower layer wirings disposed on the substrate. The first and second type semiconductor devices are disposed on the substrate. The upper and lower layer wirings electrically connect a plurality of first device regions together with a parallel connection, and connect a plurality of second device regions together with a parallel connection. The lower layer wiring includes a first contact for connecting to the first device region of at least one of the first or second type semiconductor device, the first contact being concentrated into a predetermined area of the semiconductor equipment. The lower layer wiring further includes a second contact for connecting to the second device region, the second contact surrounding the first contact. The upper layer wiring disposed on the predetermined area provides a pad area for connecting to an external circuit.

In the above equipment, the first contact of the lower layer wiring is concentrated in the predetermined area, and an interlayer insulation film disposed between the upper and lower layer wirings is flattened or eliminated. Then, the upper layer wiring is formed thereon. Simultaneously, a contact portion for bonding to the upper layer wiring can be secured widely. Therefore, a crack at the interlayer insulation film can be limited to generate, so that an electric short or a leakage of current is reduced. Moreover, since the upper layer wiring is formed without any interlayer insulation film or formed on the flattened interlayer insulation film, a bonding strength between the upper layer wiring and a bonding wire, a solder ball or the like becomes strong.

Preferably, the semiconductor substrate includes a first semiconductor layer having a first conductive type and a second semiconductor layer having a first conductive type. And the second semiconductor layer is disposed on the first semiconductor layer, and has a doping concentration lower than that of the first semiconductor layer. The first type semiconductor device is a lateral type metal oxide semiconductor transistor, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the second semiconductor layer so as to separate from the source diffusion region. The second type semiconductor device is a vertical type metal oxide semiconductor transistor, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain connection diffusion region. The drain connection diffusion region separates from the source diffusion region, is disposed from the surface of the second semiconductor layer, and reaches the first semiconductor layer. The first device region is a source of the lateral type metal oxide semiconductor transistor and the vertical type metal oxide semiconductor transistor. The second device region is a drain of the lateral type metal oxide semiconductor transistor and the vertical type metal oxide semiconductor transistor. The first contact connects to the source of the vertical type metal oxide semiconductor transistor.

In the above equipment, since the vertical type MOS transistor and the lateral type MOS transistor are used in the equipment, an ON-state resistance of the semiconductor equipment is reduced, compared with that of semiconductor equipment, which is composed of the vertical type MOS transistor only.

Preferably, the drain diffusion region of the second type semiconductor device, which is not concentrated into the predetermined area, has a doping concentration higher than that of the drain diffusion region of the first type semiconductor device. In this equipment, a potential gradient in the second type semiconductor device is reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Semiconductor equipment 200 according to a first embodiment of the present invention is shown in FIGS. 1–4. The semiconductor equipment 200 includes a lateral type metal oxide semiconductor (i.e., lateral MOS) transistor as the first type semiconductor device and a vertical type metal oxide semiconductor (i.e., vertical type MOS) transistor as the second type semiconductor device.

Figure 4:
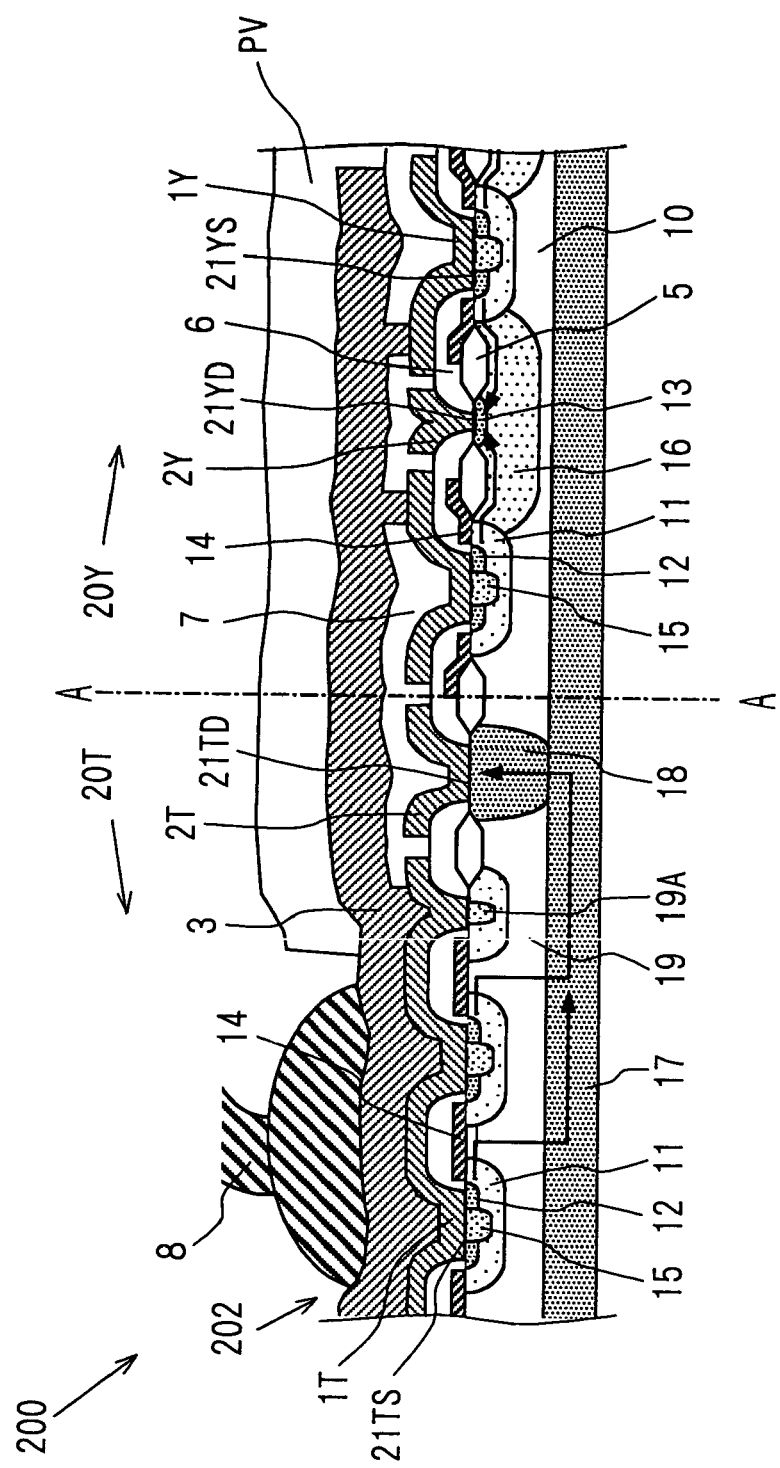
FIG. 4 is a schematic cross-sectional view taken along line IV—IV in FIG. 3.

As shown in FIG. 4, the lateral type MOS transistor is formed in a lateral type MOS region 20Y, which is disposed on the right side of line A—A. The lateral type MOS transistor is a L-DMOS transistor, and formed on a semiconductor substrate having an N type semiconductor layer 10 and an $N^+$ type semiconductor layer 17. On a surface portion of the semiconductor layer 10, a P type channel diffusion region 11 is formed. The channel diffusion region 11 terminates almost at an end of a local oxidation of silicon (i.e., LOCOS) region 5. On a surface portion of the channel diffusion region 11, a $N^+$ type source diffusion region 12 is formed so as to separate from the LOCOS region 5. Further, on the surface portion of the channel diffusion region 11, a $P^+$ type diffusion region 15 is formed so as to contact the source diffusion region 12.

On a surface portion of the semiconductor layer 10, a $N^+$ type drain diffusion region 13 is formed so as to contact the LOCOS region 5. The drain diffusion region 13 is a heavy doped region, i.e., a high concentration region. An N type well region 16 is formed so as to surround the drain diffusion region 13 and the LOCOS region 5. A gate electrode 14 is formed on the surface of the channel diffusion region 11 through a gate insulation film (not shown), which is disposed between the source diffusion region 12 and the LOCOS region 5.

The gate electrode 14 is covered with the first interlayer insulation film 6. On the first interlayer insulation film 6, the first source wiring 1Y as a lower layer wiring and the first drain wiring 2Y as a lower layer wiring are formed. The first source wiring 1Y connects to the source diffusion region 12 and the diffusion region 15 through a contact hole of the first interlayer insulation film 6, i.e., the first source wiring 1Y connects to a source of the lateral type MOS transistor through a lower layer contact 21YS. The first drain wiring 2Y connects to the drain diffusion region 13 through the contact hole, i.e., the first drain wiring 2Y connects to a drain of the lateral type MOS transistor through a lower layer contact 21YD.

In the lateral type MOS transistor, electrons move in a lateral direction from the source diffusion region 12 to the drain diffusion region 13, as shown arrows in FIG. 4. Here, a passivation film PV is formed on the second source wiring 3.

On the other hand, the vertical type MOS transistor is formed in a vertical type MOS region 20T, which is disposed on the left side of line A—A. In the vertical type MOS transistor, the $N^+$ type semiconductor layer 17 is used as a drain. The $N^+$ type semiconductor layer 17 is disposed under the N type semiconductor layer 10, and is highly doped. The P type channel diffusion region 11, the $N^+$ type source diffusion region 12, and the $P^+$ type diffusion region 15 have the same function as those of the lateral type MOS transistor. An $N^+$ type drain connection diffusion region 18 connects to the semiconductor layer 17. A P type diffusion region 19 and a $P^+$ type diffusion region 19A relieve electric field disposed outside the channel diffusion region 11, so that the withstand voltage of the vertical type MOS transistor is limited to decrease.

The first source wiring 1T as a lower layer wiring connects to a source of the vertical type MOS transistor through a lower layer contact 21TS, and the first drain wiring 2T as a lower layer wiring connects to a drain of the vertical type MOS transistor through a lower layer contact 21TD. The second source wiring 3 as the upper layer wiring connects to a source of the vertical type MOS transistor. In the vertical type MOS transistor, electrons move in a vertical direction from the source diffusion region 12 to the semiconductor layer 17 as a drain, as shown arrows in FIG. 4.

In the semiconductor equipment 200, the vertical type MOS transistor and the lateral type MOS transistor are used. Therefore, the ON-state resistance of the semiconductor equipment 200 is reduced, compared with that of semiconductor equipment, which is composed of the vertical type MOS transistor only. That is because the vertical type MOS transistor has a long current pass, which is longer than that of the lateral type MOS transistor.

Figure 1:
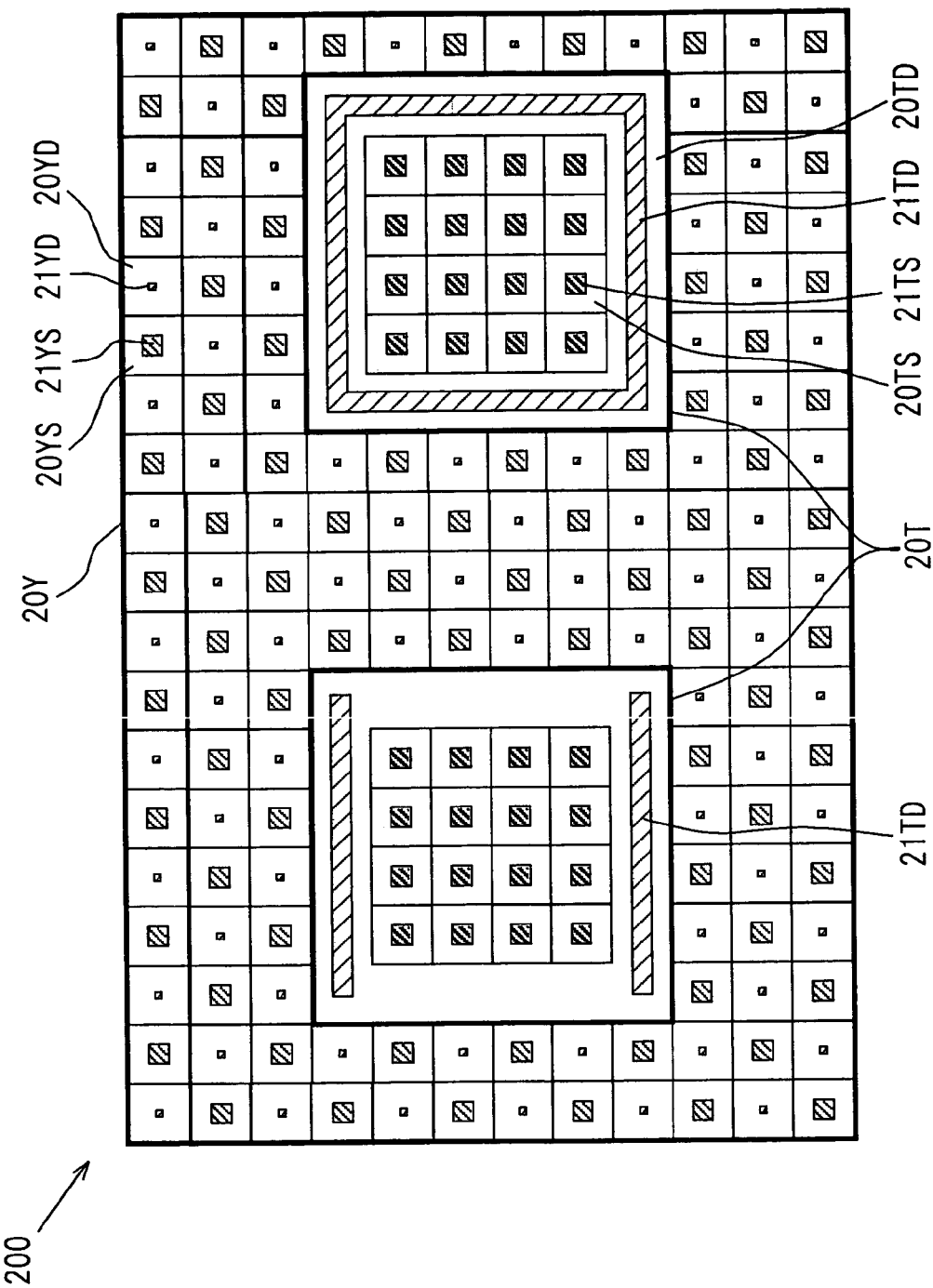
FIG. 1 is a schematic plan view showing semiconductor equipment according to a first embodiment of the present invention.

In FIG. 1, the vertical type MOS region 20T is shown as a square, in which the vertical type MOS transistor is disposed. Outside the vertical type MOS region 20T, the lateral type MOS region 20Y is disposed. The lateral type MOS transistor is disposed in the lateral type MOS region 20Y. The lateral type MOS region 20Y includes a source region 20YS and a drain region 20YD. The source region 20YS and the drain region 20YD are aligned alternately, and have almost the square shape. The source region 20YS has the lower layer contact 21YS, which has a large contact area for connecting to the lower layer wiring, i.e., the first source wiring 1Y. The drain region 20YD has the lower layer contact 21YD, which has a small contact area for connecting to the lower layer wiring. i.e., the first drain wiring 2Y.

In the vertical type MOS region 20T disposed both sides in FIG. 1, a source region 20TS is concentrated in a center portion. The source region 20TS is a square shape with the same dimension as that of the source region 20YS in the lateral type MOS region 20Y. The source region 20TS has the lower layer contact 21TS, which has a large contact area for connecting to the lower layer wiring, i.e., the second source wiring 1T. A drain region 20TD is disposed around the source region 20TS. The drain region 20TD has the lower layer contact 21TD, which has a small contact area for connecting to the lower layer wiring, i.e., the second drain wiring 2T. The lower layer contact 21TD of the drain region 20TD surrounds the lower layer contact 21TS of the source region 20TS concentrated in the center portion. The P type diffusion region 19 (not shown) and the $P^+$ type diffusion region 19A (not shown) relieve electric field disposed outside the channel diffusion region 11, so that the withstand voltage of the vertical type MOS transistor is limited to decrease.

Figure 2:
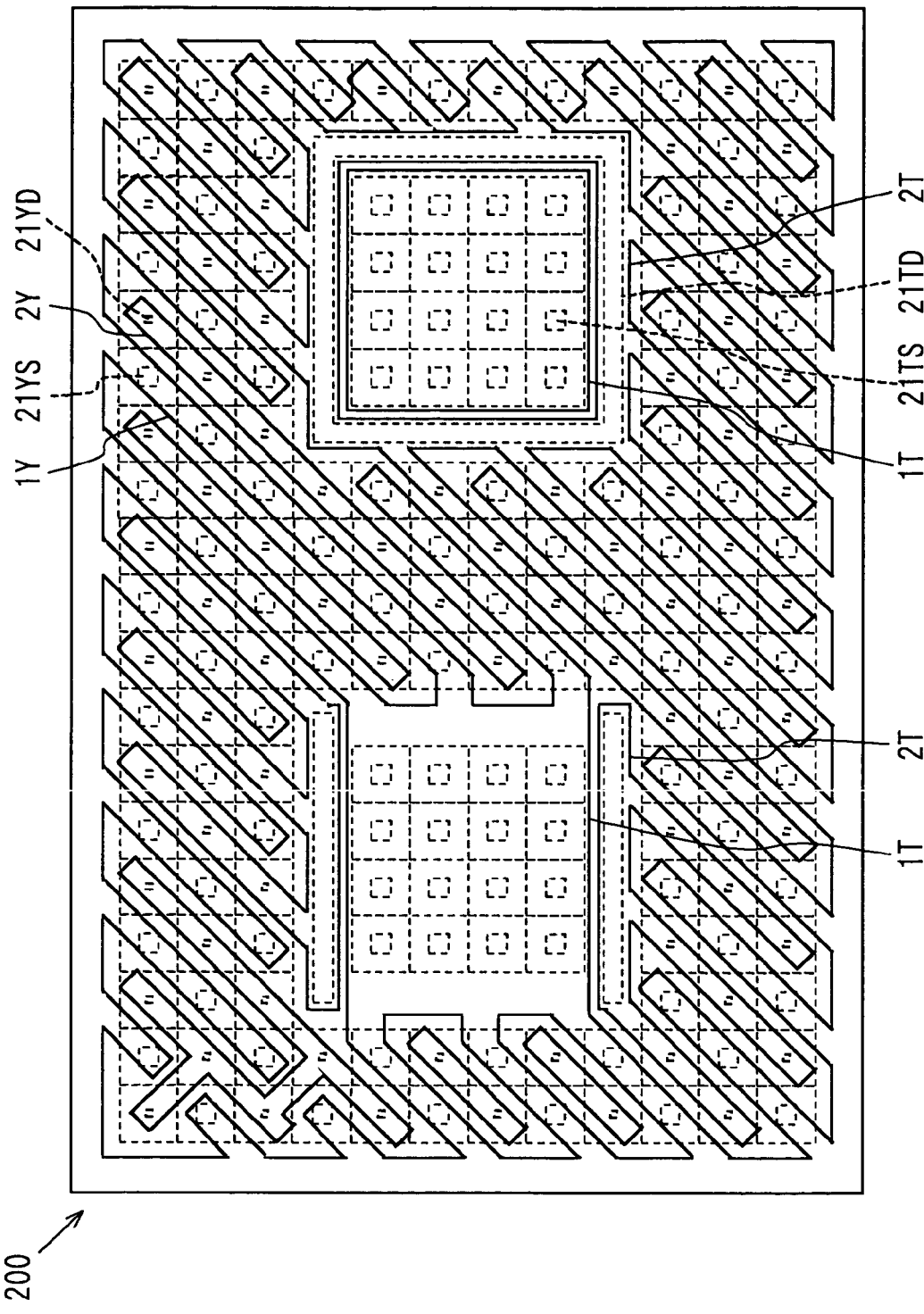
FIG. 2 is a plan view explaining an arrangement of a lower layer wiring of the semiconductor equipment according to the first embodiment.

As shown in FIG. 2, the lower wiring layer of the semiconductor equipment 200 includes the lower layer wrings 1Y, 2Y, 1T, 2T. In a region providing the lateral type MOS transistor, the first source wiring 1Y connects to the lower layer contact 21YS for the source of the lateral type MOS transistor, and the first drain wiring 2Y connects to the lower layer contact 21YD for the drain of the lateral type MOS transistor. The first source and drain wirings 1Y, 2Y as the lower layer wiring are aligned alternately, and are composed of narrow lines. In a region providing the vertical type MOS transistor on the right side, the first source wiring 1T as the lower layer wiring connects to the lower layer contact 21TS, and the first drain wiring 2T as the lower layer wiring connects to the lower layer contact 21TD. The first source wiring IT is disposed in a center portion, and has a wide area, since the lower layer contact 21TS of the source is concentrated into the center portion. The first drain wiring 2T as the lower layer wiring surrounds the first source wiring 1T, and disposed on the lower layer contact 21TD of the drain.

In a region providing the vertical type MOS transistor on the left side, the first source wiring 1T is disposed in the center portion, and has a large area. The first drain wiring 2T sandwiches both sides of the first source wiring 1T.

Figure 3:
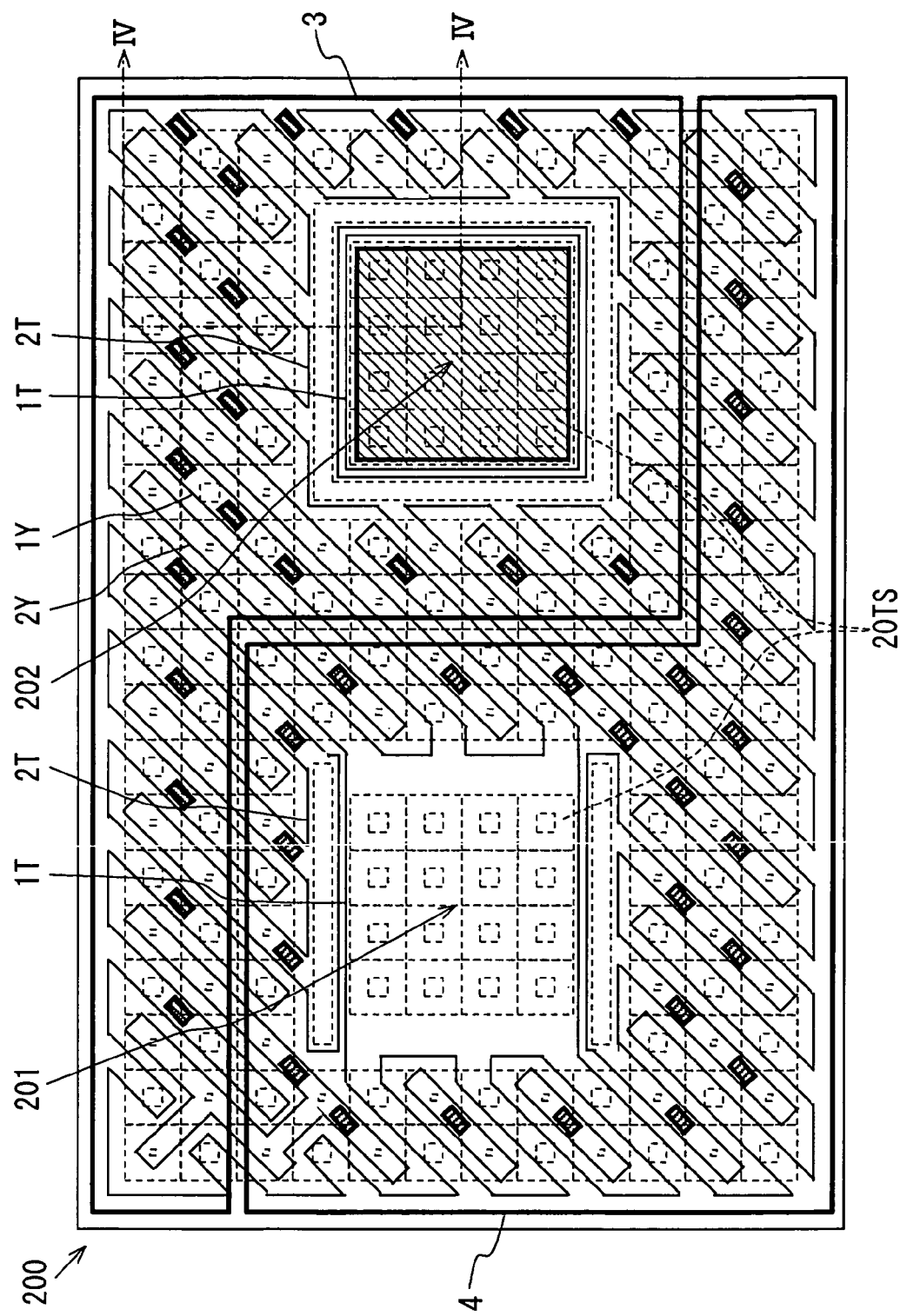
FIG. 3 is a plan view explaining a contact between upper and lower layer wirings of the semiconductor equipment according to the first embodiment.

FIG. 3 shows upper and lower layer wirings 1T, 2T, 1Y, 2Y, 3, 4 of the semiconductor equipment 200. The second source wiring 3 as the upper layer wiring connects the first source wirings 1T, 1Y corresponding to each source of the vertical and lateral type MOS transistors, and the second drain wiring 4 as the upper layer wiring connects the first drain wirings 2T, 2Y corresponding to each drain of the vertical and lateral type MOS transistors. Thus, in the lateral type MOS transistors and the vertical type MOS transistors formed in the semiconductor equipment 200, all of the source regions 20YS, 20TS are electrically connected each other with parallel connection, and all of the drain regions 20YD, 20TD are also electrically connected each other with parallel connection. Here, a contact portion for connecting to the first source wiring 1T of the vertical type MOS transistor has a wide area corresponding to a wide area of the first source wiring 1T.

In the semiconductor equipment 200, pad regions 201, 202 for bonding to the upper layer wirings 3, 4 are disposed on the source region 20TS, which is concentrated in the center portion. The pad regions 201, 202 expose from the passivation film PV. In this area, the first source wiring 1T has a wide area, and the pad regions 201, 202 for the upper layer wirings 3, 4 also have wide areas. Moreover, in the vertical type MOS region 20T on the right side of the semiconductor equipment 200, the second source wiring 3 is formed on the vertical type MOS transistor without any interlayer insulation film, as shown in FIG. 4.

In the vertical type MOS region 20T on the left side of the semiconductor equipment 200, the second drain wiring 4 is formed through a flat interlayer insulation film 7, which has no concavity and convexity portion. Therefore, the semiconductor equipment 200 is limited to crack at the interlayer insulation film 7, so that an electric short circuit and current leakage in the equipment 200 are reduced to occur. Moreover, the semiconductor equipment 200 has highly bonding strength between the upper layer wiring and a bonding wire, a solder ball or the like, since the interlayer insulation film is flattened or the equipment 200 has no interlayer insulation film and then the upper layer wirings 3, 4 are formed.

(Second Embodiment)

Semiconductor equipment 300 according to a second embodiment of the present invention is shown in FIGS. 5–8. The semiconductor equipment 300 includes the first lateral type MOS transistor as the first type semiconductor device and the second lateral type MOS transistor as the second type semiconductor device, which has a different structure.

The first lateral type MOS transistor includes a square source region 30YS and a square drain region 30YD. The second lateral type MOS transistor includes a rectangular source region 30ZS and a rectangular drain region 30ZD.

Figure 5:
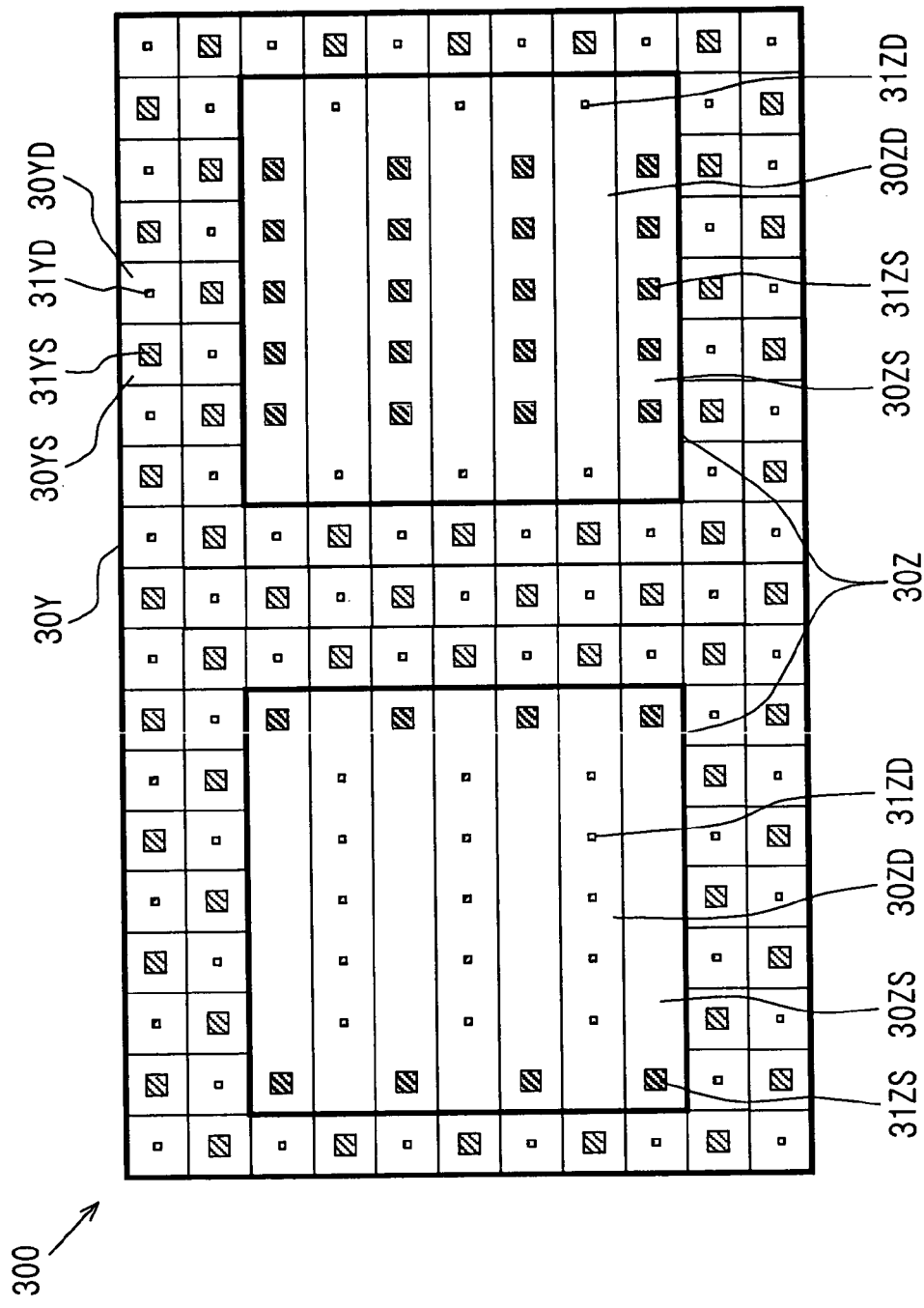
FIG. 5 is a schematic plan view showing semiconductor equipment according to a second embodiment of the present invention.

As shown in FIG. 5, the second lateral type MOS transistor is formed in a second lateral type MOS region 30Z. The rectangular source region 30ZS and the rectangular drain region 30ZD are aligned alternately in the second lateral type MOS region 30Z. The first lateral type MOS transistor is formed in a first lateral type MOS region 30Y, which is disposed outside the second lateral type MOS region 30Z. The square source region 30YS and the square drain region 30YD are aligned alternately in the first lateral type MOS region 30Y. The first source wirings 1Y, 1Z as the lower layer wirings connect to source regions 30YS, 30ZS of the first and second lateral type MOS transistors through lower layer contacts 31YS, 31ZS, respectively, and the lower wirings 2Y, 2Z connect to drain regions 30YD, 30ZD of the first and second lateral type MOS transistors through lower layer contacts 31YD, 31ZD, respectively.

In the first lateral type MOS region 30Y, in which the first lateral type MOS transistor is formed, the source region 30YS and the drain region 30YD are aligned alternately. Therefore, the lower layer contacts 31YS, 31YD are also aligned alternately. In the second lateral type MOS region 30Z on the right side of the semiconductor equipment 300, in which the second lateral type MOS transistor is formed, the lower layer contact 31ZS for connecting the lower layer wiring, i.e., the first source wiring 1Z to the source is concentrated into the center portion. The lower layer contact. 31ZD for connecting the lower layer wiring, i.e., the first drain wiring 2Z to the drain is disposed both sides of the lower layer contact 31ZS. In the second lateral type MOS region 30Z on the left side of the semiconductor equipment 300, in which the second type lateral type MOS transistor is formed, the lower layer contact 31ZD for connecting the lower layer wiring, i.e., the first drain wiring 2Z to the drain is concentrated into the center portion. The lower layer contact 31ZS for connecting the lower layer wiring, i.e., the first source wiring 1Z to the source is disposed both sides of the lower layer contact 31ZD.

In the semiconductor equipment 300, the drain region 30ZD and the source region 30ZS of the second lateral type MOS transistor have a rectangular shape, and the drain region 30YD and the source region 30YS of the first lateral type MOS transistor have a square shape. The first and second lateral type MOS transistor having a square or rectangular shape are assembled so that each lower layer contact 31ZS, 31ZD for connecting to the source or the drain of the second lateral type MOS transistor is concentrated in the center portion, respectively.

Figure 8:
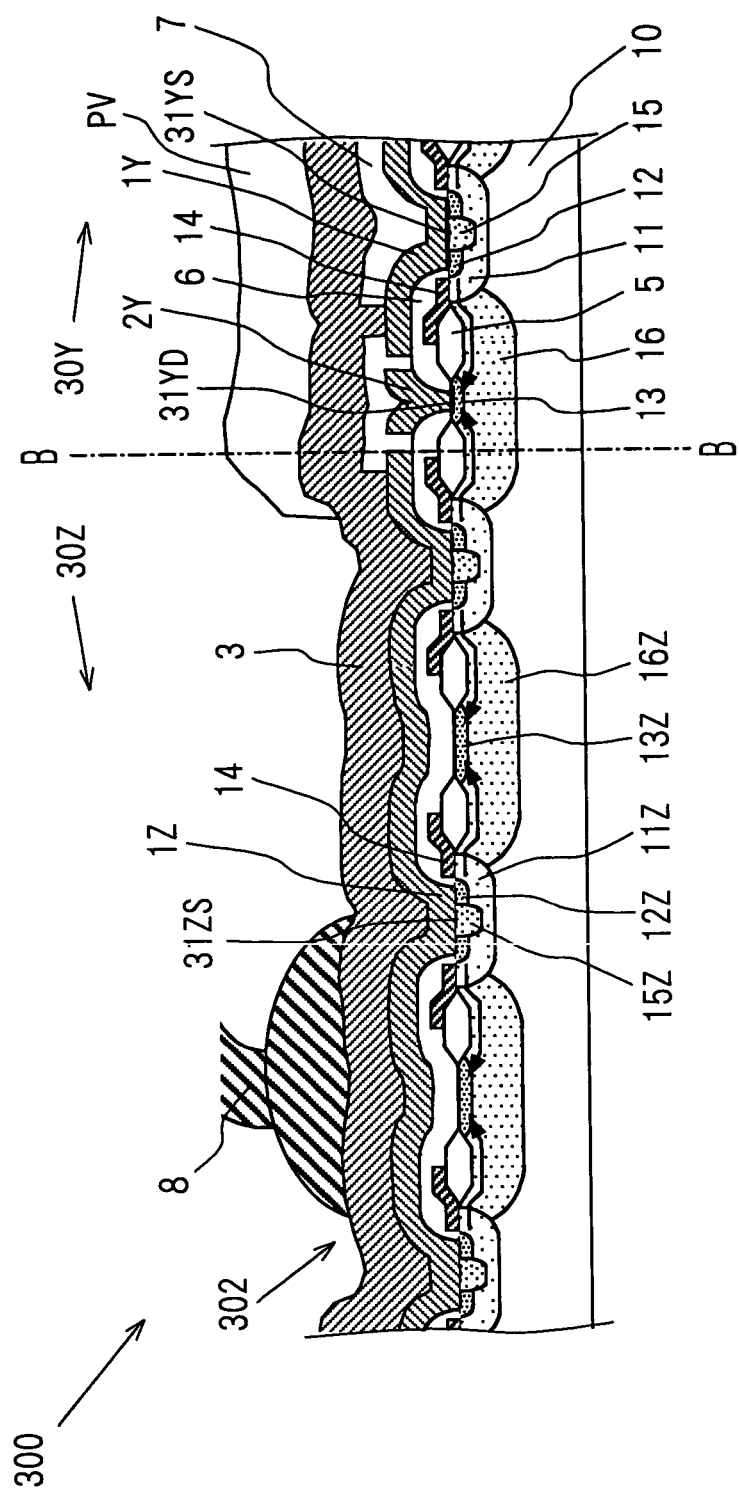
FIG. 8 is a schematic cross-sectional view taken along line VIII—VIII in FIG. 7.

In FIG. 8, the first lateral type MOS transistor is formed on the right side of line B—B, and has the same structure as the L-DMOS shown in FIG. 4. The lower layer wirings 1Y, 2Y connect to the source and the drain of the first lateral type MOS transistor, respectively. The lower layer contacts 31YS, 31YD connect the lower layer wiring and the source or the drain, respectively.

In FIG. 8, the second lateral type MOS transistor is formed on the left side of line B—B. In the second lateral type MOS transistor, a P type channel diffusion region 11Z, an $N^+$ type source diffusion region 12Z, a $P^+$ type diffusion region 15Z, an $N^+$ drain diffusion region 13Z, and an N type well region 16Z have the same cross-sectional structure as the first lateral type MOS transistor, and have the same doping concentration as the first type MOS transistor. The first source wiring 1Z as the lower layer wiring connects to the source of the second lateral type MOS transistor. The lower layer contact 31ZS connects the lower layer wiring to the source. The second source wiring 3 connects to the source. In the first and second lateral type MOS transistors, electrons move in a lateral direction from the source diffusion region 12, 12Z to the drain diffusion region 13, 13Z, as shown arrows in FIG. 8.

The semiconductor equipment 300 is composed of the lateral type MOS transistor only. Therefore, the ON-stat resistance of the transistor is much reduced, compared with the vertical type MOS transistor, which has a long current pass.

In the semiconductor equipment 300, each doping concentration of the source diffusion region 12 and the drain diffusion region 13 of the first lateral type MOS transistor is equal to that of the source diffusion region 12Z and the drain diffusion region 13Z of the second lateral type MOS transistor, respectively. Therefore, the source diffusion regions 12, 12Z of the first and second lateral type MOS transistors can be formed simultaneously, i.e., can be formed with one process. Further, the drain diffusion regions 13, 13Z of the first and second lateral type MOS transistors can be also formed simultaneously, i.e., can be formed with another one process.

In the second lateral type MOS transistor, a doping concentration of the source or the drain diffusion region, the lower layer contact of which is not concentrated in the center portion, can be set higher than that in the first lateral type MOS transistor. For example, the doping concentration of the drain diffusion region 13Z of the second lateral MOS transistor disposed on the left side in FIG. 8 sets higher than that of the drain diffusion region 13 of the first lateral MOS transistor disposed on the right side in FIG. 8. In this case, in the second lateral MOS transistor disposed on the right side in FIG. 5, electrons move in the drain diffusion region 13Z easily and rapidly, so that a potential gradient in the second lateral type MOS transistor is reduced. Here, the potential gradient is caused by unevenness of distance between the lower layer contacts. In the second lateral MOS transistor disposed on the right side, each distance between the lower layer contacts is uneven.

Similarly, the doping concentration of the source diffusion region 12Z of the second lateral MOS transistor disposed on the left side in FIG. 5 sets higher than that of the source diffusion region 12 of the first lateral MOS transistor. In this case, in the second lateral MOS transistor disposed on the left side in FIG. 5, electrons move in the source diffusion region 12Z easily and rapidly, so that a potential gradient in the second lateral type MOS transistor is reduced.

Figure 9:
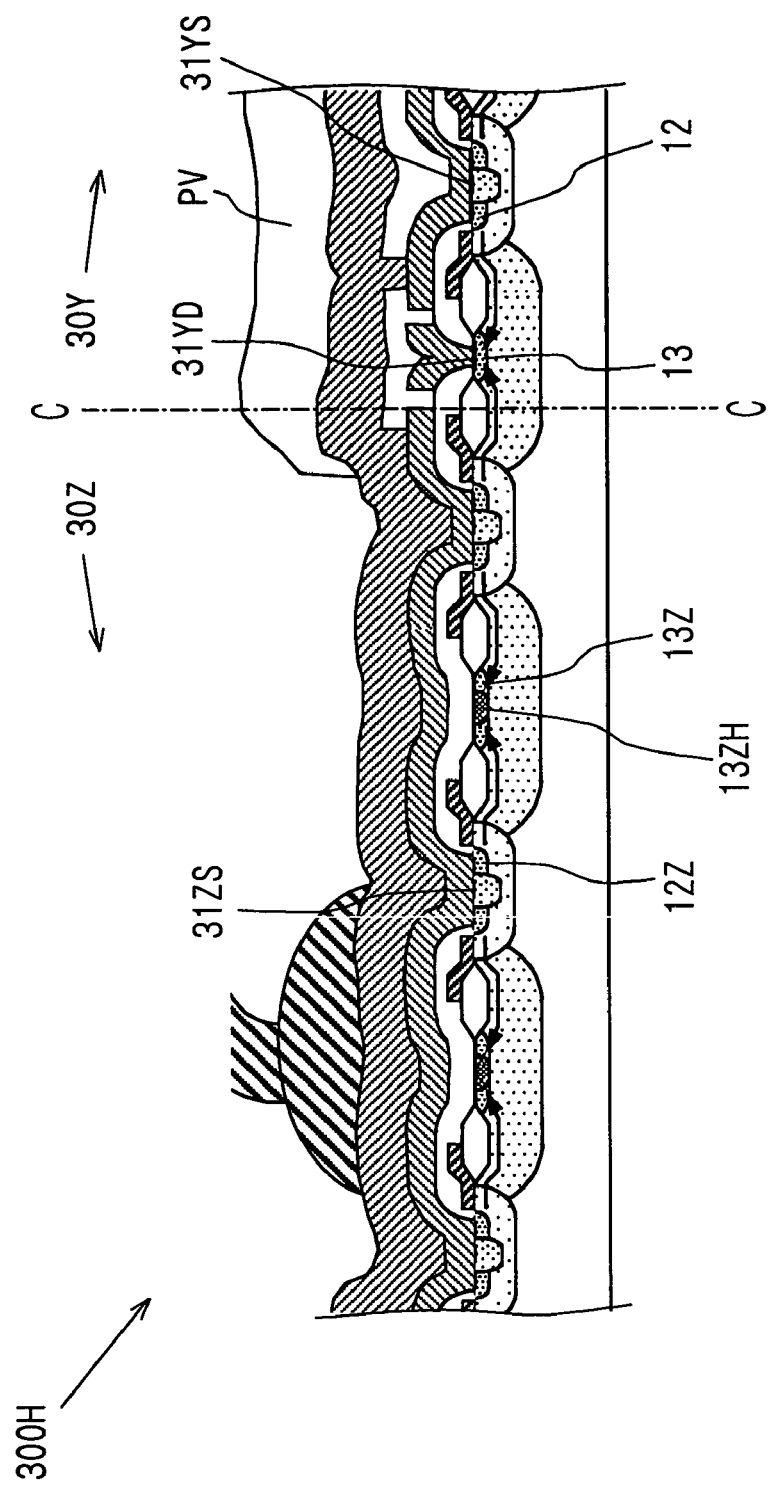
FIG. 9 is a schematic cross-sectional view showing semiconductor equipment according to a modification of the second embodiment.

Moreover, in semiconductor equipment 300H shown in FIG. 9, the drain diffusion region 13Z can further include a much higher concentration drain diffusion region 13ZH in the second lateral type MOS transistor. This drain diffusion region 13ZH enables electrons to move easily and rapidly in the drain diffusion regions 13ZH, 13Z, so that a potential gradient in the second lateral type MOS transistor is reduced.

Figure 6:
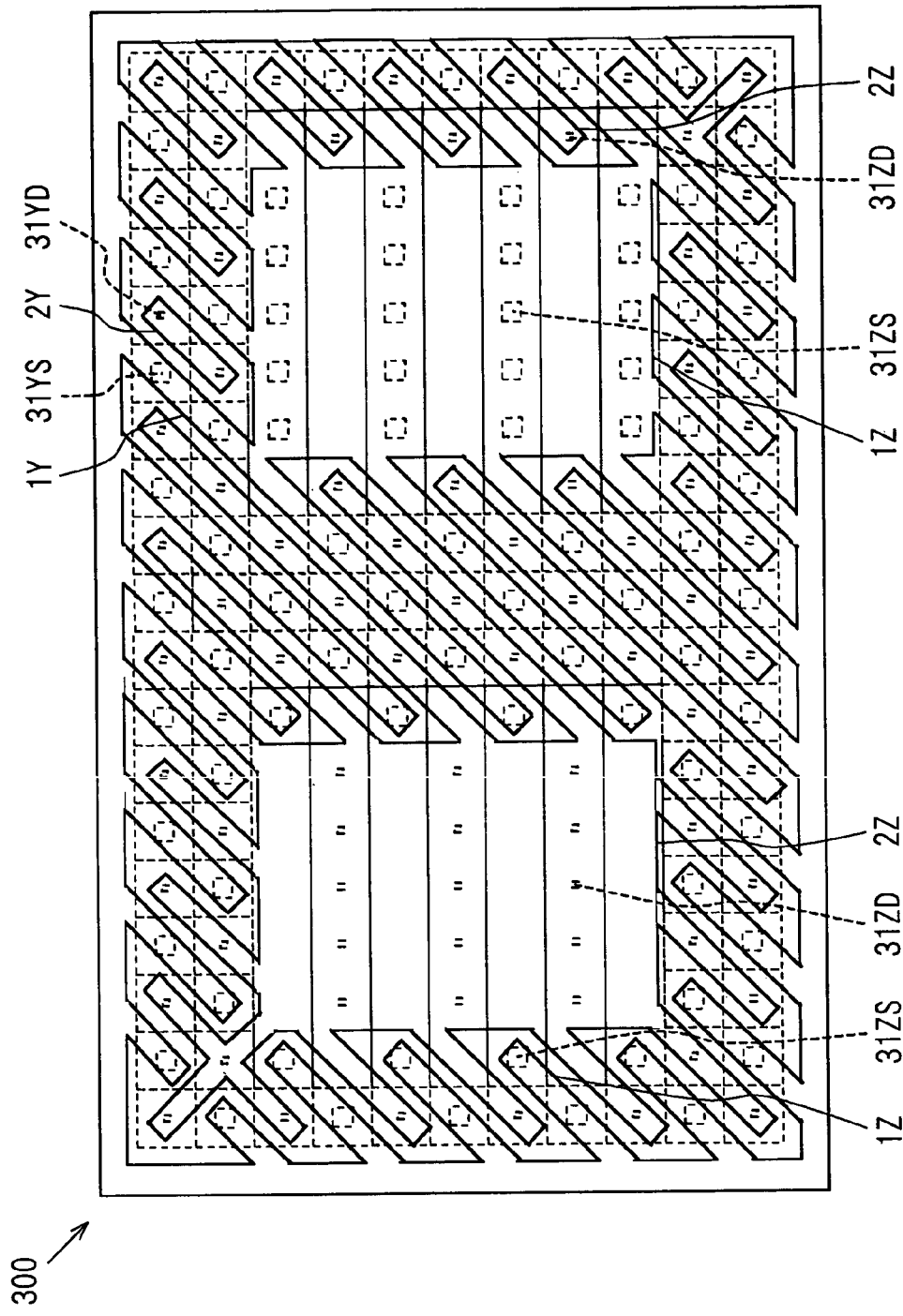
FIG. 6 is a plan view explaining an arrangement of a lower layer wiring of the semiconductor equipment according to the second embodiment.

As shown in FIG. 6, in the first lateral type MOS region 30Y, in which the first lateral type MOS transistor is formed, the lower layer wiring of the semiconductor equipment 300 includes the first source and drain wrings 1Y, 2Y. The first source wiring 1Y connects to the lower layer contact 31YS for the source of the first lateral type MOS transistor, and the first drain wiring 2Y connects to the lower layer contact 31YD for the drain of the first lateral type MOS transistor. The lower layer wirings 1Y, 2Y are aligned alternately, and are composed of narrow lines. In the second lateral type MOS region 30Z on the right side of the semiconductor equipment 300, in which the second lateral type MOS transistor is formed, the lower layer contact 31ZS for connecting the lower layer wiring to the source of the second lateral type MOS transistor is concentrated into the center portion. Therefore, the first source wiring 1Z for the source is disposed on the center portion, and has a wide area. In the second lateral type MOS region 30Z on the left side, the lower layer contact 31ZD for connecting the lower layer wiring to the drain of the second lateral type MOS transistor is concentrated into the other center portion. Therefore, the lower layer wiring 2Z for the drain is disposed on the other center portion, and also has a wide area.

Figure 7:
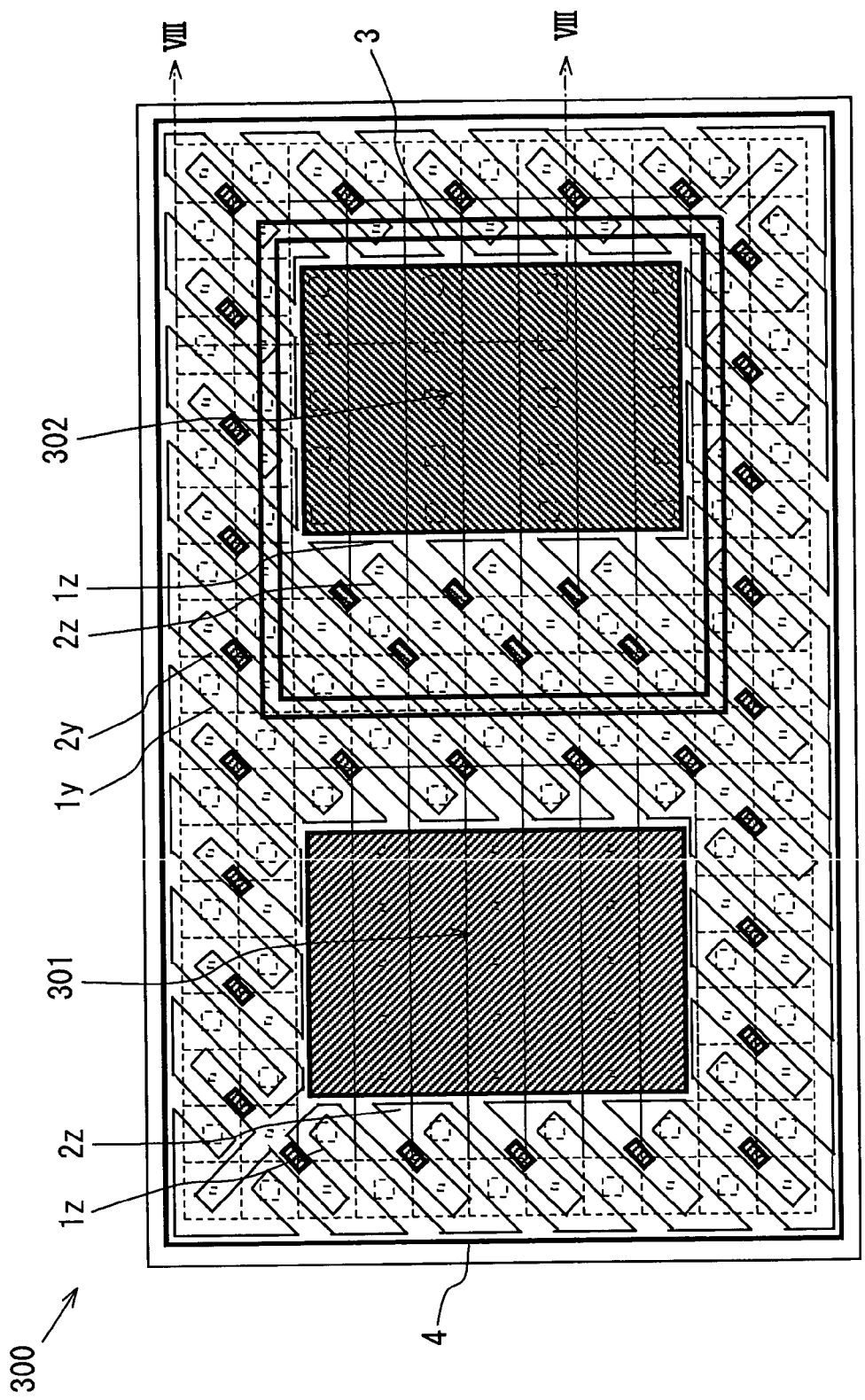
FIG. 7 is a plan view explaining a contact between upper and lower layer wirings of the semiconductor equipment according to the second embodiment.

FIG. 7 shows the upper and lower layer wirings 1Y, 1Z, 2Y, 2Z, 3, 4 of the semiconductor equipment 300. The second source wiring 3 as the upper layer wiring connects to the lower layer wirings 1y, 1Z corresponding to the source. The second drain wiring 4 as the upper layer wiring connects to the lower layer wirings 2y, 2Z corresponding to the drain. Thus, in the first and second lateral type MOS transistors formed in the semiconductor equipment 300, all of the source regions 30YS, 30TS are electrically connected together with the parallel connection, and all of the drain regions 30YD, 30TD are also electrically connected together with the parallel connection. Here, a contact portion for connecting to the first source wiring 1Z of the second lateral type MOS transistor on the right side has a wide area. This contact portion connects to the second source wiring 3. Also, another contact portion for connecting to the first drain wiring 2Z of the second lateral type MOS transistor on the left side has a wide area. The other contact portion connects to the second drain wiring 4.

In the semiconductor equipment 300, bonding pads 301, 302 for bonding the upper layer wirings 3, 4 are disposed on the lower layer contacts 31ZD, 31ZS, respectively. Here, the lower layer contact 31ZD for the source is disposed on the second lateral type MOS transistor on the left side, and the lower layer contact 31ZS for the source is disposed on the second lateral type MOS transistor on the right side. The first source and drain wirings as the lower layer wiring 1Z, 2Z in these areas have a wide area. Moreover, the pad regions 301, 302, which are formed to expose the upper layer wirings 3, 4 from the passivation film PV, are also wide.

Further, the upper layer wirings 3, 4 without any interlayer insulation film are formed on the concentrated lower layer contact 31ZS for the source and on the concentrated lower layer contact 31ZD for the drain in the second lateral type MOS transistors on the right and left sides of the semiconductor equipment 300, respectively, as shown in FIG. 7. Therefore, the semiconductor equipment 300 is limited to crack at the interlayer insulation film, so that an electric short circuit and current leakage in the equipment 300 are reduced to occur. Moreover, the semiconductor equipment 300 has highly bonding strength between the upper layer wiring and a bonding wire, a solder ball or the like, since the equipment 300 has no interlayer insulation film and then the upper layer wirings 3, 4 are formed.

Figure 10A:
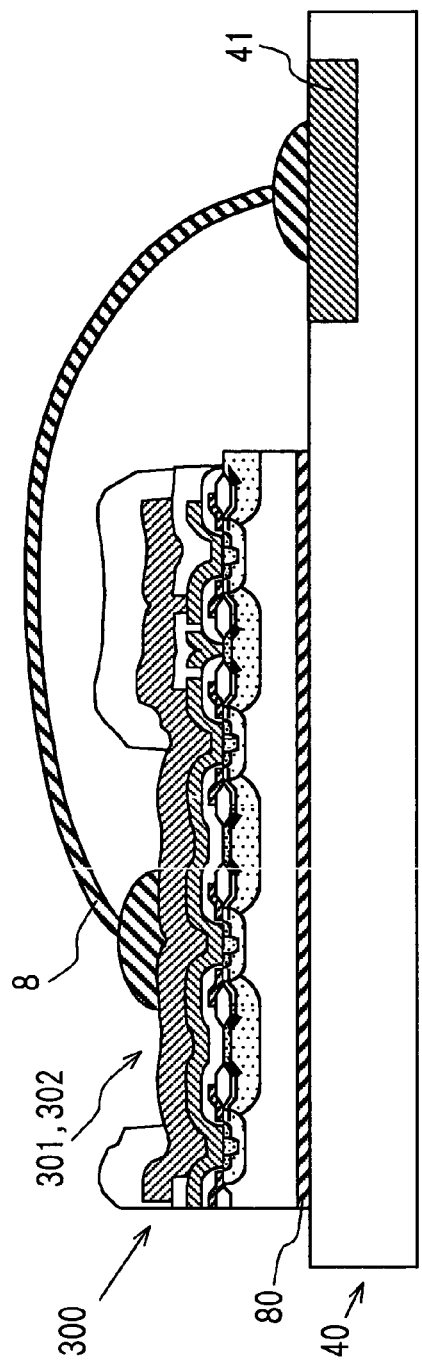
FIG. 10A is a schematic cross-sectional view explaining a mounting configuration of semiconductor equipment mounted on a printed circuit board by a bonding connection method.
Figure 10B:
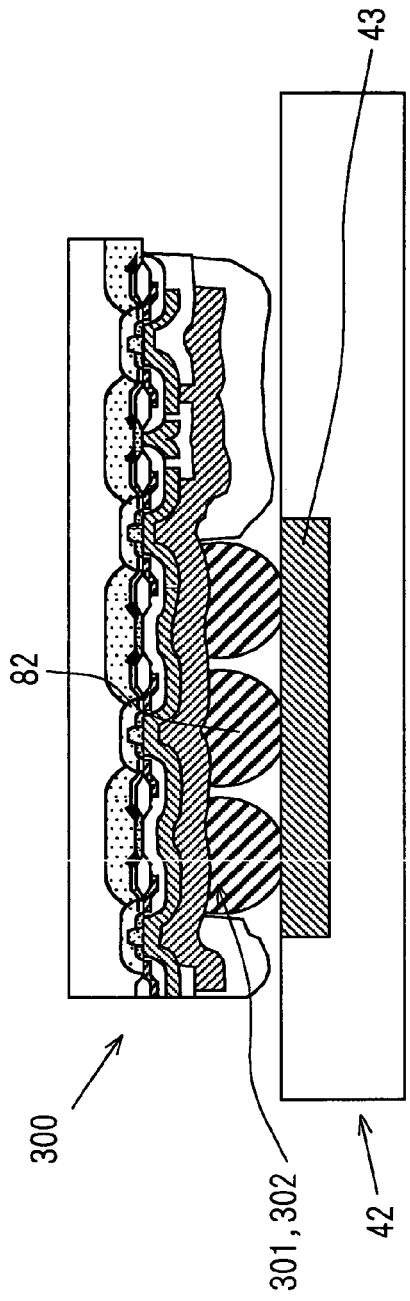
FIG. 10B is a schematic cross-sectional view explaining a mounting configuration of the semiconductor equipment mounted on a printed circuit board by a flip chip mounting method, according to a third embodiment of the present invention.

FIG. 10A is a schematic cross-sectional view explaining a mounting configuration of the semiconductor equipment 300 mounted on a printed circuit board 40 by a bonding connection method, and FIG. 10B is a schematic cross-sectional view explaining a mounting configuration of the semiconductor equipment 300 mounted on a printed circuit board 42 by a flip chip mounting method.

As shown in FIG. 10A, the semiconductor equipment 300 is mounted on the printed circuit board 40 by using a solder 80 and the like. The pad region 301, 302 of the semiconductor equipment 300 connect to a pad 41 of the printed circuit board 40 by using a wire made of gold, aluminum, and the like.

As shown in FIG. 10B, the semiconductor equipment 300 is mounted on the printed circuit board 42 by using a solder ball 82 such that the pad regions 301, 302 of the semiconductor equipment 300 face a pad 43 of the printed circuit board 42.

(Third Embodiment)

Figure 11:
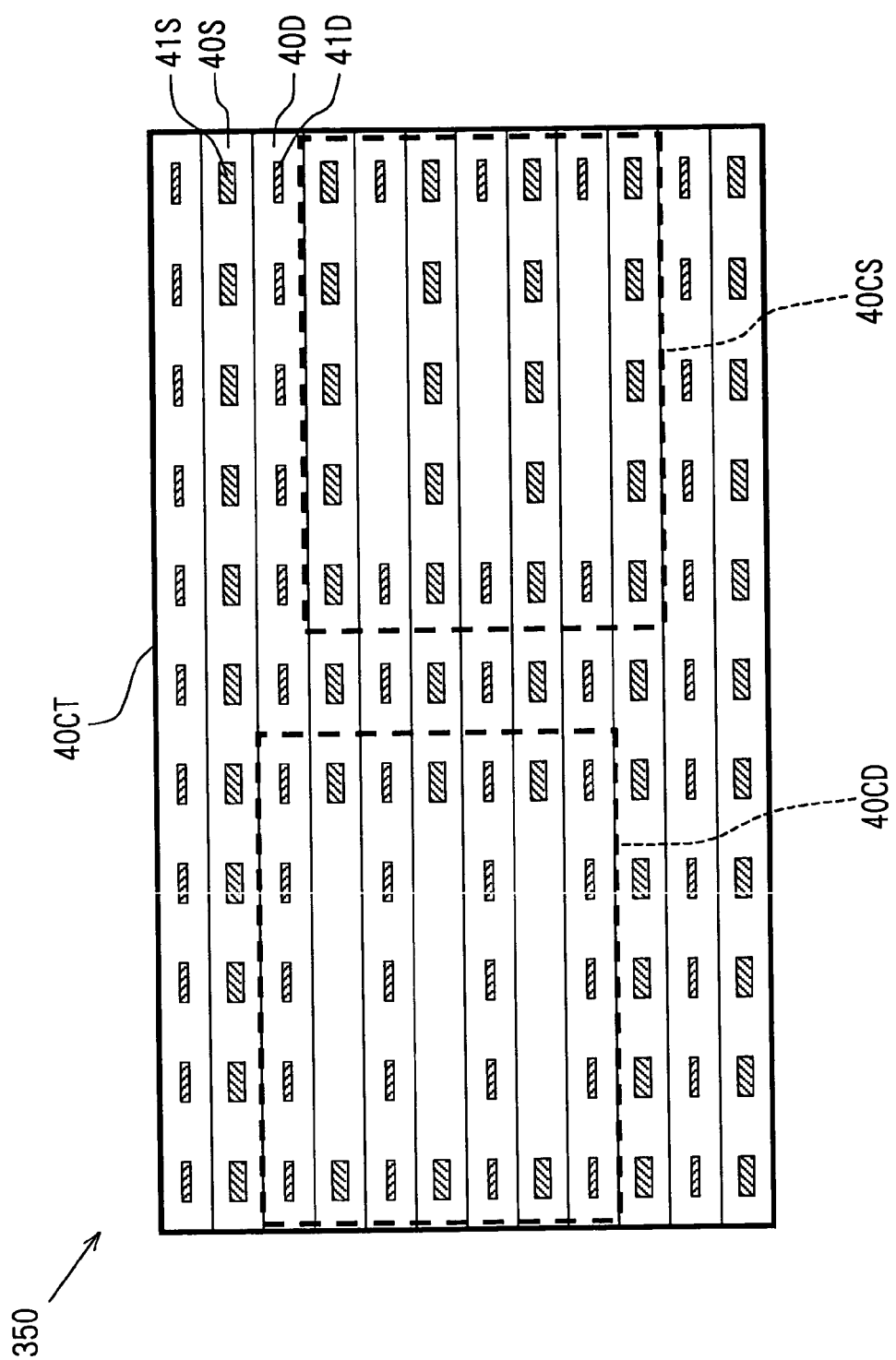
FIG. 11 is a plan view showing semiconductor equipment according to the third embodiment.
Figure 12:
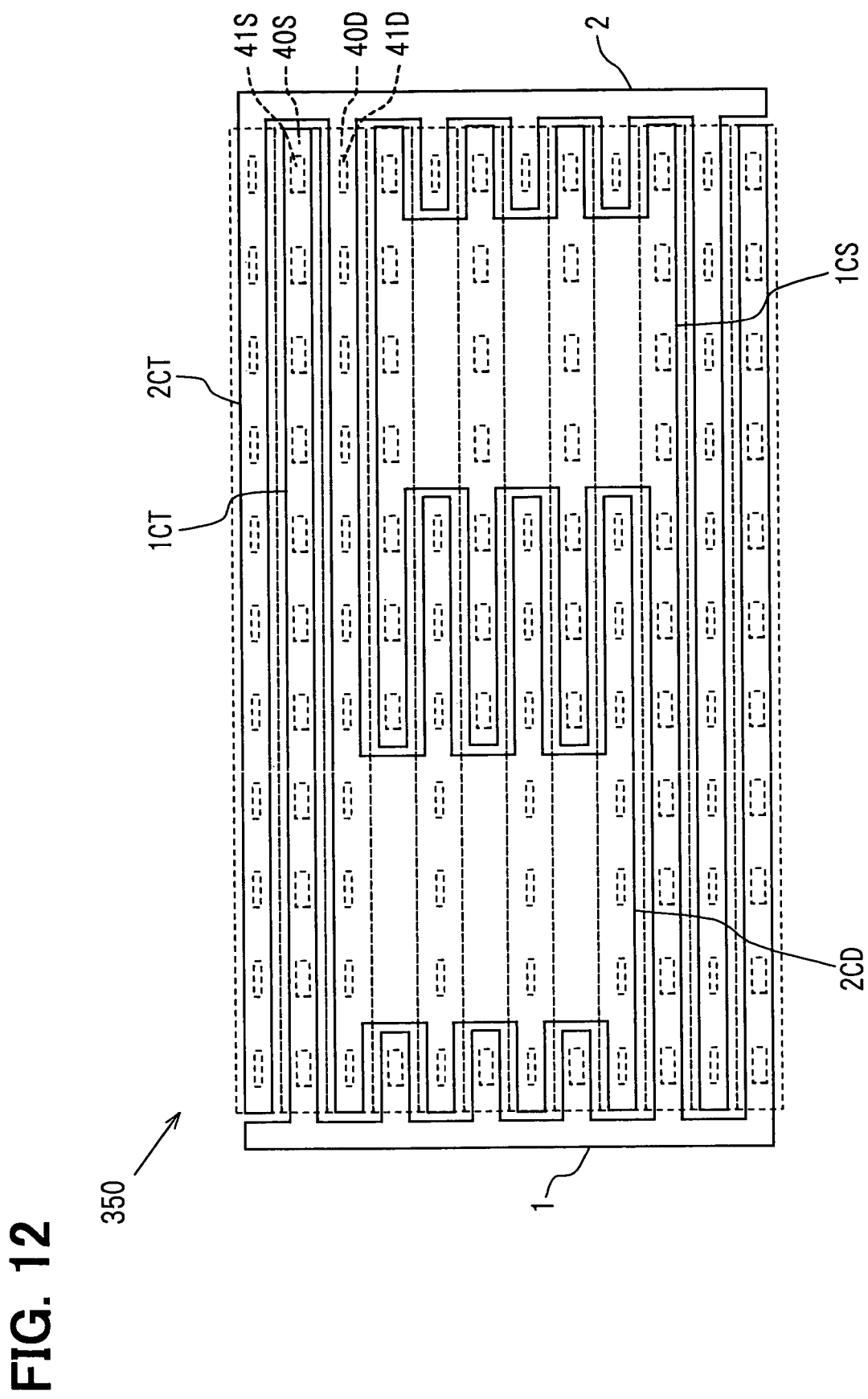
FIG. 12 is a plan view explaining an arrangement of a lower layer wiring of the semiconductor equipment according to the third embodiment.
Figure 13:
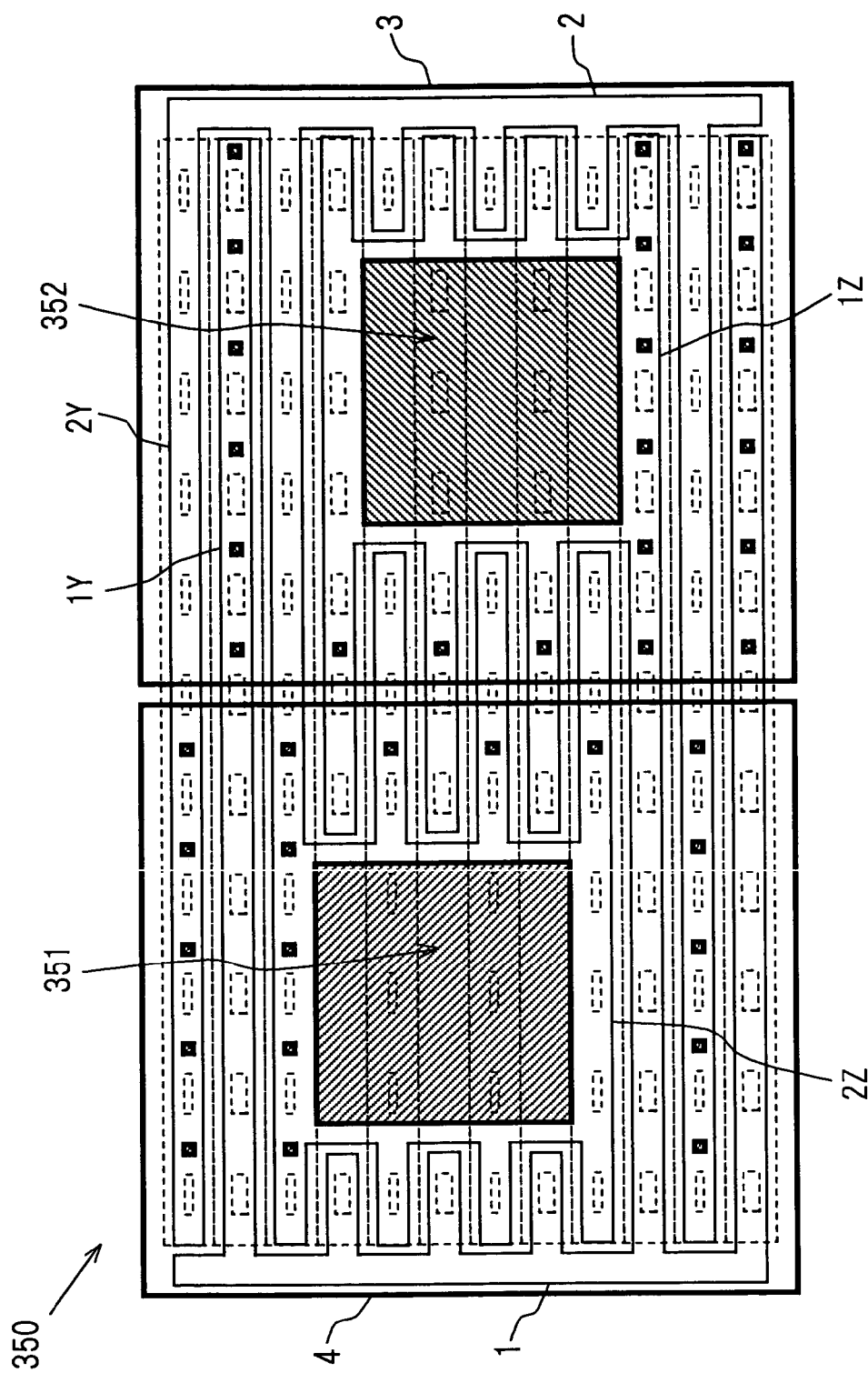
FIG. 13 is a plan view explaining a contact between upper and lower layer wirings of the semiconductor equipment according to the third embodiment.

Semiconductor equipment 350 according to a third embodiment is shown in FIGS. 11–13. The semiconductor equipment 350 includes a source region 40S and a drain region 40D, each of which has a rectangular shape. The source region 40S and the drain region 40D are disposed alternately. A lower layer contact 41S connects to the source region 40S of the lower layer wiring. A lower layer contact 41D connects to the drain region 40D of the lower layer wiring. Each cross-sectional construction of the source region 40S and the drain region 40D is almost the same as that in the second lateral type MOS transistor on the left side in FIG. 8.

In FIG. 11, the first portion 40CD surrounded by a broken line is disposed on the left side. In the first portion 40CD, the lateral type MOS transistor is formed such that the lower layer contact 41S connecting to the source region 40S and disposed in the center of the first portion 40CD is reduced and the lower layer contact 41D connecting to the drain region 40D is concentrated in the center of the first portion 40CD.

The second portion 40CS surrounded by a broken line is disposed on the right side in FIG. 11. In the second portion 40CS, the lateral type MOS transistor is formed such that the lower layer contact 41D connecting to the source region 40D and disposed in the center of the second portion 40CS is reduced and the lower layer contact 41S connecting to the drain region 40S is concentrated in the center of the second portion 40CS.

The third portion 40CT surrounded by a solid line except for the above portions 40CD, 40CS is disposed inside the outline of the semiconductor equipment 350 in FIG. 11. In the third portion 40CT, the lateral type MOS transistor is formed such that each lower layer contact 41S, 41D is disposed in the source region 40S and the drain region 40D at even intervals, respectively. Thus, in a case where the lateral type MOS transistor having the rectangular shape source region 40S and the rectangular shape drain region 40D is formed in a semiconductor substrate, the lower layer wiring 41S, 41D connecting to the source region 40S or the drain region 40D can be concentrated in a predetermined portion, i.e., the center portion.

In the semiconductor equipment 350, a doping concentration of the source or the drain diffusion region, the lower layer contact of which is not concentrated in the center portion and disposed in the first portion 40CD or the second portion 40CS, can be set higher than that disposed in the third portion 40CT surrounding the first and second portions 40CD, 40CS. In this case, in the lateral MOS transistor disposed in the first and second portions 40CD, 40CS, which has uneven distance between the lower layer contacts, electrons move in the drain diffusion region easily and rapidly, so that a potential gradient in the lateral type MOS transistor is reduced.

As shown in FIG. 12, each of the first source wiring 1 and the first drain wiring 2 in the semiconductor equipment 350 includes a wide area portion 1CS, 2CD and a narrow line portion 1CT, 2CT, respectively, which correspond to the first and second portions 40CS, 40CD and the third portion 40CT. Therefore, the source region 40S and the drain region 40D disposed alternately in the semiconductor equipment 350 are connected each other electrically with a parallel connection by the first source and drain wirings 1, 2.

As shown in FIG. 13, each wide area portion 1CS, 2CD has the wide area lower layer contact, which provides a pad region 351, 352 for bonding to the second source or drain wiring 3, 4, respectively.

Therefore, the second source and drain wirings 3, 4 are formed on the lateral type MOS transistor without any interlayer insulation film. Thus, the semiconductor equipment 350 is limited to crack at the interlayer insulation film, so that an electric short circuit and current leakage in the equipment 350 are reduced to occur. Moreover, the semiconductor equipment 350 has highly bonding strength between the upper layer wiring and a bonding wire, a solder ball or the like, since the equipment 350 has no interlayer insulation film and then the upper layer wirings 3, 4 are formed.

(Fourth Embodiment)

Figure 14A:
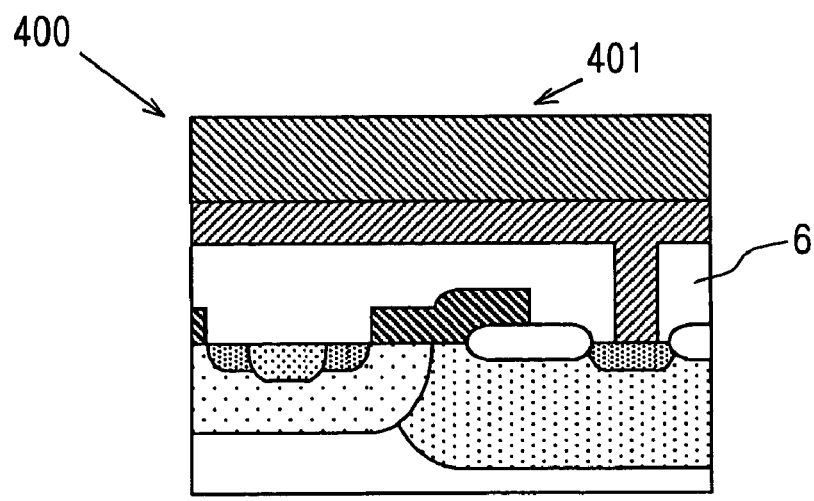
FIGS. 14A and 14B are partially enlarged cross-sectional views showing semiconductor equipments according to a fourth embodiment of the present invention.

Semiconductor equipment 400 according to a fourth embodiment of the present invention is shown in FIG. 14A. The semiconductor equipment 400 includes a boro-phospho-silicate glass (i.e., BPSG) as the first interlayer insulation film 6. The first interlayer insulation film 6 made of BPSG is flattened by a chemical mechanical polishing (i.e., CMP) method. Therefore, the first drain wiring 4 as the upper layer wiring is also flattened, so that bonding strength between the upper layer wiring 4 and a bonding wire such as aluminum wire becomes stronger. Here, a pad region 401 is formed on the first drain wiring 4.

Figure 14B:
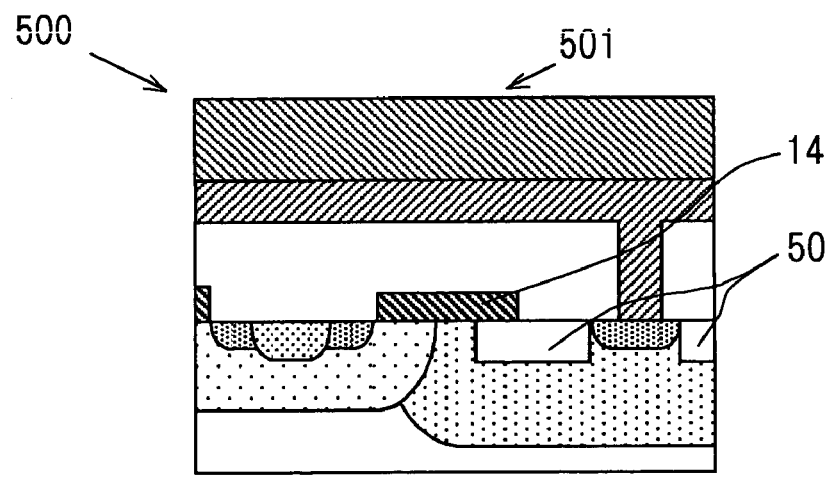

As shown in FIG. 14B, semiconductor equipment 500 includes a shallow trench isolation (i.e., STI) region 50 instead of the LOCOS region. Although the LOCOS region has a step, the STI region 50 has no step. Therefore, the gate electrode 14 is flattened. Thus, the first drain wiring 4 as the upper layer wring is also flattened, so that bonding strength between the upper layer wiring 4 and a bonding wire such as aluminum wire becomes strong.

Figure 15:
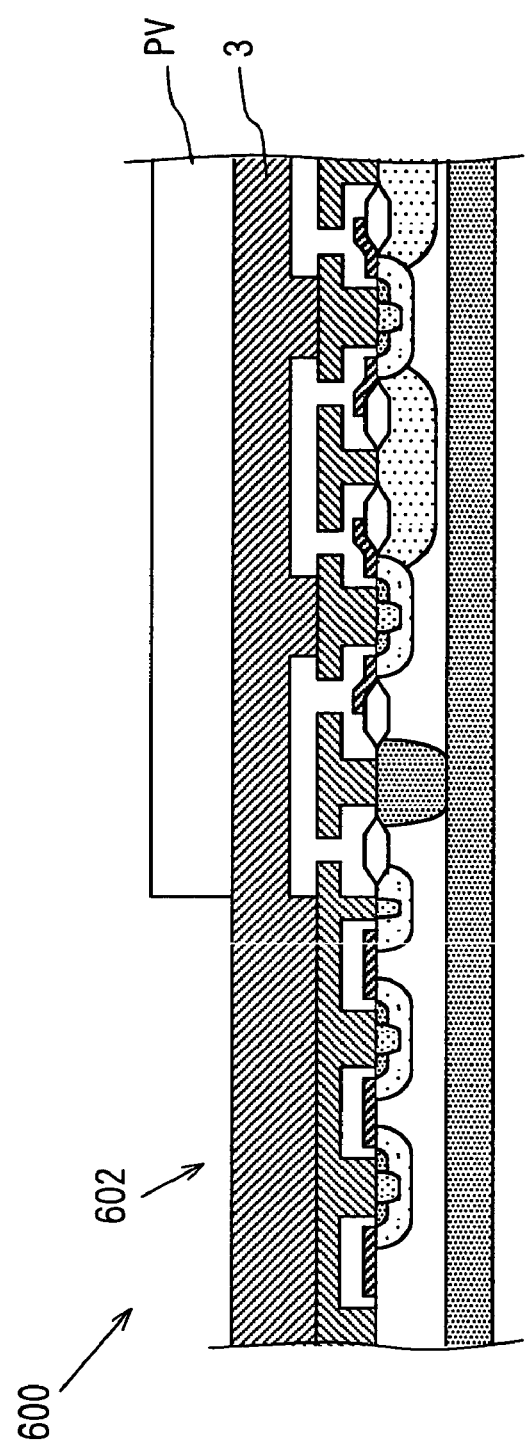
FIG. 15 is a partially enlarged cross-sectional view showing another semiconductor equipment according to the fourth embodiment.
Figure 16:
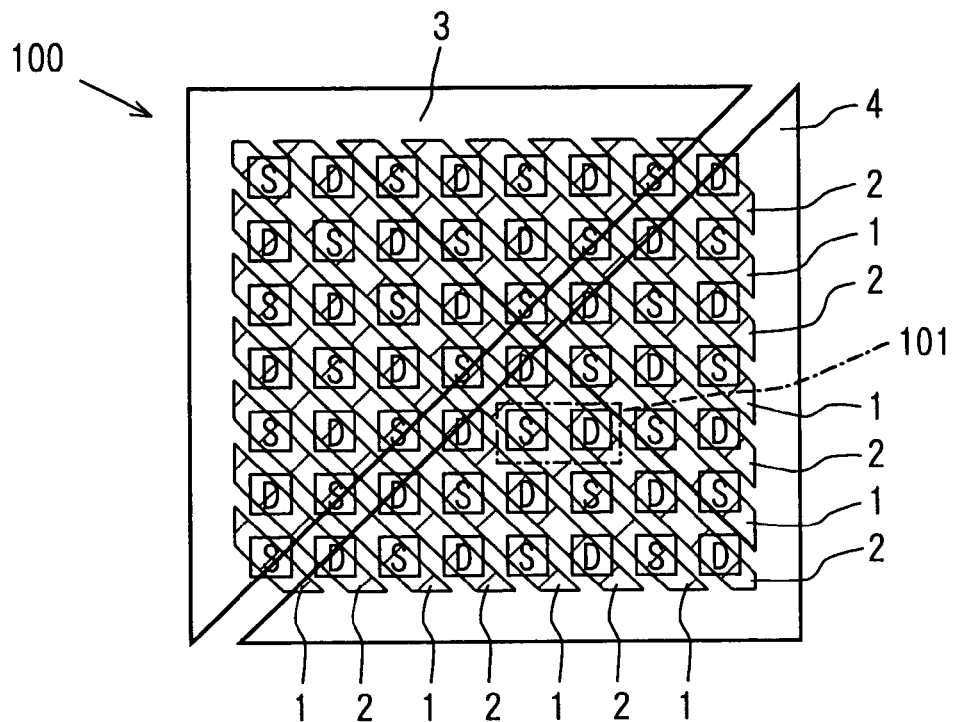
FIG. 16 is a schematic plan view showing semiconductor equipment according to a prior art.
Figure 17:
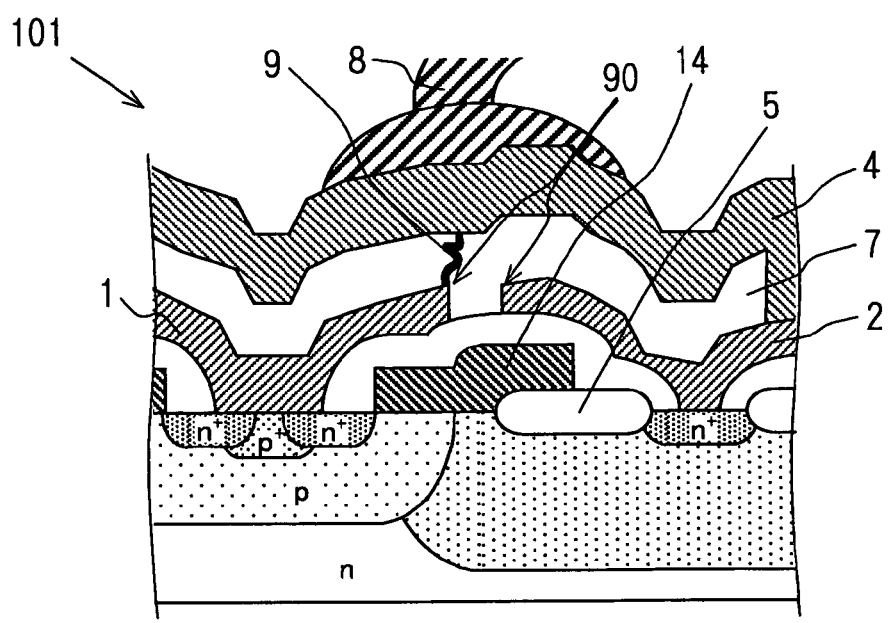
FIG. 17 is a partially enlarged cross-sectional view showing a L-DMOS transistor of the semiconductor equipment according to the prior art.

In semiconductor equipment 600 shown in FIG. 15, the first source wiring 3 is flattened by using the CMP method. A pad region 602 is formed on the first source wiring 3. Thus, the pad region 602 is also flattened, so that bonding strength between the upper layer wiring 3 and a bonding wire such as aluminum wire becomes strong.

Such changes and modifications are to be understood as being within the scope of the present invention as defined by the appended claims.

What is claimed is:

1. Semiconductor equipment comprising:
a semiconductor substrate;
a plurality of first type semiconductor devices having first and second device regions, the devices disposed on the substrate;
a plurality of second type semiconductor devices having the first and second device regions, the devices disposed on the substrate; and
upper and lower layer wirings disposed on the substrate,
wherein the upper and lower layer wirings electrically connect a plurality of first device regions together with a parallel connection, and connect a plurality of second device regions together with a parallel connection,
wherein the lower layer wiring includes a first contact for connecting to the first device region of at least one of the first or second type semiconductor device, the first contact being concentrated into a predetermined area of the semiconductor equipment,
wherein the lower layer wiring further includes a second contact for connecting to the second device region, the second contact surrounding the first contact, and
wherein the upper layer wiring disposed on the predetermined area provides a pad area for connecting to an external circuit.

2. The semiconductor equipment according to claim 1,
wherein the semiconductor substrate includes a first semiconductor layer having a first conductive type and a second semiconductor layer having a first conductive type,
wherein the second semiconductor layer is disposed on the first semiconductor layer, and has a doping concentration lower than that of the first semiconductor layer,
wherein the first type semiconductor device is a lateral type metal oxide semiconductor transistor, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the second semiconductor layer so as to separate from the source diffusion region,
wherein the second type semiconductor device is a vertical type metal oxide semiconductor transistor, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain connection diffusion region,
wherein the drain connection diffusion region separates from the source diffusion region, is disposed from the surface of the second semiconductor layer, and reaches the first semiconductor layer,
wherein the first device region is a source of the lateral type metal oxide semiconductor transistor and the vertical type metal oxide semiconductor transistor,
wherein the second device region is a drain of the lateral type metal oxide semiconductor transistor and the vertical type metal oxide semiconductor transistor, and wherein the first contact connects to the source of the vertical type metal oxide semiconductor transistor.

3. The semiconductor equipment according to claim 1,
wherein the semiconductor substrate includes a semiconductor layer having a first conductive type,
wherein the first and second type semiconductor devices are lateral type metal oxide semiconductor transistors, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the semiconductor layer so as to separate from the source diffusion region,
wherein the first and second device regions in the first type semiconductor device are aligned alternately on the semiconductor substrate, and have an almost square shape in a plan view,
wherein the first and second device regions in the second type semiconductor device are aligned alternately on the semiconductor substrate, and have an almost rectangular shape in a plan view,
wherein the first device region is a source of the first and second type semiconductor devices,
wherein the second device region is a drain of the first and second type semiconductor devices, and
wherein the first contact concentrated into the predetermined area of the semiconductor equipment connects to the source of the second type semiconductor device.

4. The semiconductor equipment according to claim 1,
wherein the semiconductor substrate includes a semiconductor layer having a first conductive type,
wherein the first and second type semiconductor devices are lateral type metal oxide semiconductor transistors, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the semiconductor layer so as to separate from the source diffusion region,
wherein the first and second device regions in the first type semiconductor device are aligned alternately on the semiconductor substrate, and have an almost square shape in a plan view,
wherein the first and second device regions in the second type semiconductor device are aligned alternately on the semiconductor substrate, and have an almost rectangular shape in a plan view,
wherein the first device region is a drain of the first and second type semiconductor devices,
wherein the second device region is a source of the first and second type semiconductor devices, and
wherein the first contact connects to the first device region of the second type semiconductor device, and concentrates into the predetermined area of the second type semiconductor device.

5. The semiconductor equipment according to claim 3,
wherein the drain diffusion region of the second type semiconductor device, which is not concentrated into the predetermined area, has a doping concentration higher than that of the drain diffusion region of the first type semiconductor device.

6. The semiconductor equipment according to claim 4,
wherein the source diffusion region of the second type semiconductor device, which is not concentrated into the predetermined area, has a doping concentration higher than that of the source diffusion region of the first type semiconductor device.

7. The semiconductor equipment according to claim 1,
wherein the semiconductor substrate includes a semiconductor layer having a first conductive type,
wherein the first and second type semiconductor devices are lateral type metal oxide semiconductor transistors, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the semiconductor layer so as to separate from the source diffusion region,
wherein the first and second device regions in each of the first and second type semiconductor devices are aligned alternately on the semiconductor substrate, and have an almost rectangular shape in a plan view,
wherein the first device region is a source of the first and second type semiconductor devices,
wherein the second device region is a drain of the first and second type semiconductor devices, and
wherein the first contact concentrated into the predetermined area of the semiconductor equipment connects to the source of the first or second type semiconductor device.

8. The semiconductor equipment according to claim 1,
wherein the semiconductor substrate includes a semiconductor layer having a first conductive type,
wherein the first and second type semiconductor devices are lateral type metal oxide semiconductor transistors, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the semiconductor layer so as to separate from the source diffusion region,
wherein the first and second device regions in each of the first and second type semiconductor devices are aligned alternately on the semiconductor substrate, and have an almost rectangular shape in a plan view,
wherein the first device region is a drain of the first and second type semiconductor devices,
wherein the second device region is a source of the first and second type semiconductor devices, and
wherein the first contact concentrated into the predetermined area of the semiconductor equipment connects to the drain of the first or second type semiconductor device.

9. The semiconductor equipment according to claim 7,
wherein the drain diffusion region of the first or second type semiconductor device, which is not concentrated into the predetermined area, has a doping concentration higher than the drain diffusion region of the first or second type semiconductor device, which has no predetermined area.

10. The semiconductor equipment according to claim 1, wherein the pad area connects to the external circuit by a wire bonding method.

11. The semiconductor equipment according to claim 1, wherein the semiconductor substrate further includes an interlayer insulation film disposed between the upper and lower layer wirings, and
wherein the interlayer insulation film is made of borophospho-silicate glass, and the surface of the interlayer insulation film is flattened by a chemical mechanical polishing method.

12. The semiconductor equipment according to claim 1, wherein the first and second device regions are separated each other by a shallow trench isolation.

13. The semiconductor equipment according to claim 1, wherein the surface of the upper layer wiring is flattened by a chemical mechanical polishing method.

14. Semiconductor equipment comprising:
a plurality of first type semiconductor devices having first and second device regions;
a plurality of second type semiconductor devices having the first and second device regions; and
upper and lower layer wirings,
wherein the upper and lower layer wirings connect the first and second device regions together with a parallel connection,
wherein the lower layer wiring includes a first contact for connecting to the first device region, the first contact being concentrated into a predetermined area of the semiconductor equipment,
wherein the lower layer wiring further includes a second contact for connecting to the second device region, the second contact surrounding the first contact, and
wherein the upper layer wiring disposed on the predetermined area provides a pad area for connecting to an external circuit.

15. The semiconductor equipment according to claim 14, the equipment further comprising:
a semiconductor substrate including a first semiconductor layer with a first conductive type and a second semiconductor layer with a first conductive type,
wherein the second semiconductor layer is disposed on the first semiconductor layer,
wherein the first type semiconductor device is a lateral diffused metal oxide semiconductor transistor, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the second semiconductor layer so as to separate from the source diffusion region,
wherein the second type semiconductor device is a vertically diffused metal oxide semiconductor transistor, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain connection diffusion region,
wherein the drain connection diffusion region separates from the source diffusion region, is disposed from the surface of the second semiconductor layer, and reaches the first semiconductor layer,
wherein the first device region is a source of the laterally diffused metal oxide semiconductor transistor and the vertically diffused metal oxide semiconductor transistor,
wherein the second device region is a drain of the laterally diffused metal oxide semiconductor transistor and the vertically diffused metal oxide semiconductor transistor, and
wherein the first contact connects to the source of the vertically diffused metal oxide semiconductor transistor.

16. Semiconductor equipment comprising:
a semiconductor substrate;
a plurality of first type semiconductor devices having first and second device regions, the devices disposed on the substrate;
a plurality of second type semiconductor devices having the first and second device regions, the devices disposed on the substrate; and
upper and lower layer wirings disposed on the substrate,
wherein the upper and lower layer wirings electrically connect a plurality of first device regions together with a parallel connection, and connect a plurality of second device regions together with a parallel connection,
wherein the lower layer wiring includes a first contact for connecting to the first device region of at least one of the first or second type semiconductor device, the first contact being concentrated into a predetermined area of the semiconductor equipment,
wherein the lower layer wiring further includes a second contact for connecting to the second device region, the second contact surrounding the first contact,
wherein the upper layer wiring disposed on the predetermined area provides a pad area for connecting to an external circuit,
wherein the semiconductor substrate includes a first semiconductor layer having a first conductive type and a second semiconductor layer having a first conductive type,
wherein the second semiconductor layer is disposed on the first semiconductor layer, and has a doping concentration lower than that of the first semiconductor layer,
wherein the first type semiconductor device is a lateral type metal oxide semiconductor transistor, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the second semiconductor layer so as to separate from the source diffusion region,
wherein the second type semiconductor device is a vertical type metal oxide semiconductor transistor, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain connection diffusion region, wherein the drain connection diffusion region separates from the source diffusion region, is disposed from the surface of the second semiconductor layer, and reaches the first semiconductor layer, wherein the first device region is a source of the lateral type metal oxide semiconductor transistor and the vertical type metal oxide semiconductor transistor, wherein the second device region is a drain of the lateral type metal oxide semiconductor transistor and the vertical type metal oxide semiconductor transistor, and wherein the first contact connects to the source of the vertical type metal oxide semiconductor transistor.

17. The semiconductor equipment according to claim 16, wherein the semiconductor substrate includes a semiconductor layer having a first conductive type, wherein the first and second type semiconductor devices are lateral type metal oxide semiconductor transistors, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the semiconductor layer so as to separate from the source diffusion region, wherein the first and second device regions in the first type semiconductor device are aligned alternately on the semiconductor substrate, and have an almost square shape in a plan view, wherein the first and second device regions in the second type semiconductor device are aligned alternately on the semiconductor substrate, and have an almost rectangular shape in a plan view, wherein the first device region is a source of the first and second type semiconductor devices, wherein the second device region is a drain of the first and second type semiconductor devices, and wherein the first contact concentrated into the predetermined area of the semiconductor equipment connects to the source of the second type semiconductor device.

18. The semiconductor equipment according to claim 16, wherein the semiconductor substrate includes a semiconductor layer having a first conductive type, wherein the first and second type semiconductor devices are lateral type metal oxide semiconductor transistors, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the semiconductor layer so as to separate from the source diffusion region, wherein the first and second device regions in the first type semiconductor device are aligned alternately on the semiconductor substrate, and have an almost square shape in a plan view, wherein the first and second device regions in the second type semiconductor device are aligned alternately on the semiconductor substrate, and have an almost rectangular shape in a plan view, wherein the first device region is a drain of the first and second type semiconductor devices, wherein the second device region is a source of the first and second type semiconductor devices, and wherein the first contact connects to the first device region of the second type semiconductor device, and concentrates into the predetermined area of the second type semiconductor device.

19. The semiconductor equipment according to claim 16, wherein the drain diffusion region of the second type semiconductor device, which is not concentrated into the predetermined area, has a doping concentration higher than that of the drain diffusion region of the first type semiconductor device.

20. The semiconductor equipment according to claim 16, wherein the source diffusion region of the second type semiconductor device, which is not concentrated into the predetermined area, has a doping concentration higher than that of the source diffusion region of the first type semiconductor device.

21. The semiconductor equipment according to claim 16, wherein the semiconductor substrate includes a semiconductor layer having a first conductive type, wherein the first and second type semiconductor devices are lateral type metal oxide semiconductor transistors, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the semiconductor layer so as to separate from the source diffusion region, wherein the first and second device regions in each of the first and second type semiconductor devices are aligned alternately on the semiconductor substrate, and have an almost rectangular shape in a plan view, wherein the first device region is a source of the first and second type semiconductor devices, wherein the second device region is a drain of the first and second type semiconductor devices, and wherein the first contact concentrated into the predetermined area of the semiconductor equipment connects to the source of the first or second type semiconductor device.

22. The semiconductor equipment according to claim 16, wherein the semiconductor substrate includes a semiconductor layer having a first conductive type, wherein the first and second type semiconductor devices are lateral type metal oxide semiconductor transistors, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the semiconductor layer so as to separate from the source diffusion region, wherein the first and second device regions in each of the first and second type semiconductor devices are aligned alternately on the semiconductor substrate, and have an almost rectangular shape in a plan view, wherein the first device region is a drain of the first and second type semiconductor devices, wherein the second device region is a source of the first and second type semiconductor devices, and wherein the first contact concentrated into the predetermined area of the semiconductor equipment connects to the drain of the first or second type semiconductor device.

23. The semiconductor equipment according to claim 16, wherein the drain diffusion region of the first or second type semiconductor device, which is not concentrated into the predetermined area, has a doping concentration higher than the drain diffusion region of the first or second type semiconductor device, which has no predetermined area.

24. The semiconductor equipment according to claim 16, wherein the pad area connects to the external circuit by a wire bonding method.

25. The semiconductor equipment according to claim 16, wherein the semiconductor substrate further includes an interlayer insulation film disposed between the upper and lower layer wirings, and wherein the interlayer insulation film is made of boro-phospho-silicate glass, and the surface of the interlayer insulation film is flattened by a chemical mechanical polishing method.

26. The semiconductor equipment according to claim 16, wherein the first and second device regions are separated each other by a shallow trench isolation.

27. The semiconductor equipment according to claim 16, wherein the surface of the upper layer wiring is flattened by a chemical mechanical polishing method.

28. Semiconductor equipment comprising:

a semiconductor substrate;

a plurality of first type semiconductor devices having first and second device regions, the devices disposed on the substrate;

a plurality of second type semiconductor devices having the first and second device regions, the devices disposed on the substrate; and upper and lower layer wirings disposed on the substrate, wherein the upper and lower layer wirings electrically connect a plurality of first device regions together with a parallel connection, and connect a plurality of second device regions together with a parallel connection, wherein the lower layer wiring includes a first contact for connecting to the first device region of at least one of the first or second type semiconductor device, the first contact being concentrated into a predetermined area of the semiconductor equipment, wherein the lower layer wiring further includes a second contact for connecting to the second device region, the second contact surrounding the first contact, wherein the upper layer wiring disposed on the predetermined area provides a pad area for connecting to an external circuit wherein the semiconductor substrate includes a semiconductor layer having a first conductive type, wherein the first and second type semiconductor devices are lateral type metal oxide semiconductor transistors, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the semiconductor layer so as to separate from the source diffusion region, wherein the first and second device regions in the first type semiconductor device are aligned alternately on the semiconductor substrate, and have an almost square shape in a plan view, wherein the first and second device regions in the second type semiconductor device are aligned alternately on the semiconductor substrate, and have an almost rectangular shape in a plan view, wherein the first device region is a source of the first and second type semiconductor devices, wherein the second device region is a drain of the first and second type semiconductor devices, and wherein the first contact concentrated into the predetermined area of the semiconductor equipment connects to the source of the second type semiconductor device.

29. The semiconductor equipment according to claim 28, wherein the drain diffusion region of the second type semiconductor device, which is not concentrated into the predetermined area, has a doping concentration higher than that of the drain diffusion region of the first type semiconductor device.

30. Semiconductor equipment comprising:

a semiconductor substrate;

a plurality of first type semiconductor devices having first and second device regions, the devices disposed on the substrate;

a plurality of second type semiconductor devices having the first and second device regions, the devices disposed on the substrate; and upper and lower layer wirings disposed on the substrate, wherein the upper and lower layer wirings electrically connect a plurality of first device regions together with a parallel connection, and connect a plurality of second device regions together with a parallel connection, wherein the lower layer wiring includes a first contact for connecting to the first device region of at least one of the first or second type semiconductor device, the first contact being concentrated into a predetermined area of the semiconductor equipment, wherein the lower layer wiring further includes a second contact for connecting to the second device region, the second contact surrounding the first contact, wherein the upper layer wiring disposed on the predetermined area provides a pad area for connecting to an external circuit, wherein the semiconductor substrate includes a semiconductor layer having a first conductive type, wherein the first and second type semiconductor devices are lateral type metal oxide semiconductor transistors, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the semiconductor layer so as to separate from the source diffusion region, wherein the first and second device regions in the first type semiconductor device are aligned alternately on the semiconductor substrate, and have an almost square shape in a plan view, wherein the first and second device regions in the second type semiconductor device are aligned alternately on the semiconductor substrate, and have an almost rectangular shape in a plan view, wherein the first device region is a drain of the first and second type semiconductor devices, wherein the second device region is a source of the first and second type semiconductor devices, and wherein the first contact connects to the first device region of the second type semiconductor device, and concentrates into the predetermined area of the second type semiconductor device.

31. The semiconductor equipment according to claim 30, wherein the source diffusion region of the second type semiconductor device, which is not concentrated into the predetermined area, has a doping concentration higher than that of the source diffusion region of the first type semiconductor device.

32. Semiconductor equipment comprising:

a plurality of first type semiconductor devices having first and second device regions;

a plurality of second type semiconductor devices having the first and second device regions;

upper and lower layer wirings; and a semiconductor substrate including a first semiconductor layer with a first conductive type and a second semiconductor layer with a first conductive type, wherein the upper and lower layer wirings connect the first and second device regions together with a parallel connection, wherein the lower layer wiring includes a first contact for connecting to the first device region, the first contact being concentrated into a predetermined area of the semiconductor equipment, wherein the lower layer wiring further includes a second contact for connecting to the second device region, the second contact surrounding the first contact, wherein the upper layer wiring disposed on the predetermined area provides a pad area for connecting to an external circuit wherein the second semiconductor layer is disposed on the first semiconductor layer, wherein the first type semiconductor device is a lateral diffused metal oxide semiconductor transistor, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain diffusion region disposed on a surface portion of the second semiconductor layer so as to separate from the source diffusion region, wherein the second type semiconductor device is a vertically diffused metal oxide semiconductor transistor, which includes a second conductive type channel diffusion region disposed on a surface portion of the second semiconductor layer, a first conductive type source diffusion region disposed on a surface portion of the channel diffusion region, a gate electrode contacting a part of the channel diffusion region through a gate insulation film, and a first conductive type drain connection diffusion region, wherein the drain connection diffusion region separates from the source diffusion region, is disposed from the surface of the second semiconductor layer, and reaches the first semiconductor layer, wherein the first device region is a source of the laterally diffused metal oxide semiconductor transistor and the vertically diffused metal oxide semiconductor transistor, wherein the second device region is a drain of the laterally diffused metal oxide semiconductor transistor and the vertically diffused metal oxide semiconductor transistor, and wherein the first contact connects to the source of the vertically diffused metal oxide semiconductor transistor.

* * * * *